(12) United States Patent
Lee et al.

(10) Patent No.: US 12,507,411 B2
(45) Date of Patent: Dec. 23, 2025

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Youngsik Lee, Suwon-si (KR); Hyuk Kim, Seongnam-si (KR); Yeongeun Yook, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 346 days.

(21) Appl. No.: 18/097,332

(22) Filed: Jan. 16, 2023

(65) Prior Publication Data

US 2023/0284450 A1    Sep. 7, 2023

(30) Foreign Application Priority Data

Mar. 2, 2022   (KR) .................... 10-2022-0026988

(51) Int. Cl.
| | |
|---|---|
| *H10B 43/27* | (2023.01) |
| *H01L 23/528* | (2006.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |

(Continued)

(52) U.S. Cl.
CPC ......... *H10B 43/27* (2023.02); *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/27; H10B 43/35; H10B 43/40; H10B 43/10; H10B 41/10; H10B 41/35; H10B 41/40; H10B 41/27; H10L 23/5283
See application file for complete search history.

(56) References Cited

U.S. PATENT DOCUMENTS

| | | | |
|---|---|---|---|
| 7,041,602 B2 | 5/2006 | Takahashi | |
| 9,627,469 B2 | 4/2017 | Yi et al. | |
| 10,297,610 B2 * | 5/2019 | Kai | ........................ H10B 43/35 |

(Continued)

FOREIGN PATENT DOCUMENTS

| | | |
|---|---|---|
| CN | 107316807 A | 11/2017 |
| KR | 1020050015815 A | 2/2005 |
| KR | 1020220016250 A | 2/2022 |

*Primary Examiner* — Mary Ellen Bowman
(74) *Attorney, Agent, or Firm* — Muir Patent Law, PLLC

(57) ABSTRACT

A semiconductor device and an electronic system including the same are provided. The semiconductor device may include a stacked structure including electrodes stacked on a substrate, interlayer insulating layers interposed between the electrodes, and an upper insulating layer covering the uppermost electrode among the electrodes, and a vertical structure passing through the stacked structure in a vertical direction, and each of the interlayer insulating layers may have a first thickness, and the upper insulating layer may have a second thickness greater than the first thickness, and the upper insulating layer may include an insulating material different from an insulating material of each of the interlayer insulating layers.

20 Claims, 17 Drawing Sheets

(51) Int. Cl.
   *H10B 43/35*   (2023.01)
   *H10B 43/40*   (2023.01)

(56) References Cited

U.S. PATENT DOCUMENTS

| | | |
|---|---|---|
| 10,325,922 B2 | 6/2019 | Lim et al. |
| 2015/0255486 A1* | 9/2015 | Kameoka ............... H10B 41/35 257/314 |
| 2018/0108672 A1* | 4/2018 | Choi ...................... H10B 43/27 |
| 2018/0130816 A1* | 5/2018 | Son ....................... H10B 43/27 |
| 2021/0399019 A1* | 12/2021 | Cho ....................... H10B 51/30 |
| 2022/0223524 A1* | 7/2022 | Choi ...................... H10B 41/41 |
| 2023/0217658 A1* | 7/2023 | Choi ................... H10D 64/037 438/478 |

* cited by examiner

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2022-0026988, filed on Mar. 2, 2022, in the Korean Intellectual Property Office, the entire contents of which are hereby incorporated by reference.

BACKGROUND

The inventive concept relates to a semiconductor device and an electronic system including the same.

A semiconductor device capable of storing high-capacity data in an electronic system for data storage is increasingly required in electronic systems. Accordingly, a method for increasing the data storage capacity of a semiconductor device is being studied. For example, as a method for increasing the data storage capacity of the semiconductor device, a semiconductor device including memory cells arranged three-dimensionally instead of two-dimensionally arranged memory cells has been proposed.

SUMMARY

An embodiment of the inventive concept provides a semiconductor device with improved reliability and integration.

An embodiment of the inventive concept provides an electronic system including the semiconductor device.

Objectives solved by the inventive concept are not limited to the above-described objectives, and other objectives, which are not described above, may be clearly understood by those skilled in the art through the following specification.

According to an embodiment of the inventive concept, a semiconductor device may include a stacked structure including electrodes stacked on a substrate, interlayer insulating layers interposed between the electrodes, and an upper insulating layer covering the uppermost electrode among the electrodes and a vertical structure passing through the stacked structure in a vertical direction, and each of the interlayer insulating layers may have a first thickness, and the upper insulating layer may have a second thickness greater than the first thickness, and the upper insulating layer may include an insulating material different from an insulating material of each of the interlayer insulating layers.

According to an embodiment of the inventive concept, a semiconductor device may include a peripheral circuit structure including peripheral circuits integrated on a semiconductor substrate, a first stacked structure including first electrodes and first interlayer insulating layers alternately stacked on the peripheral circuit structure, and a first upper insulating layer covering the uppermost first electrode among the first electrodes, a second stacked structure including second electrodes and second interlayer insulating layers alternately stacked on the first stacked structure, and a second upper insulating layer covering the uppermost second electrode among the second electrodes, and a vertical structure passing through the first and second stacked structures, and the first and second upper insulating layers may include an insulating material different from an insulating material of the first and second interlayer insulating layers.

According to an embodiment of the inventive concept, an electronic system may include a semiconductor device which includes a stacked structure including electrodes stacked on a substrate, interlayer insulating layers interposed between the electrodes, and an upper insulating layer covering the uppermost electrode among the electrodes, a vertical structure passing through the stacked structure, and an input/output pad electrically connected to peripheral circuits and a controller electrically connected to the semiconductor device through the input/output pad and configured to control the semiconductor device, and each of the interlayer insulating layers may have a first thickness, and the upper insulating layer may have a second thickness greater than the first thickness, and the upper insulating layer may include an insulating material different from an insulating material of each of the interlayer insulating layers.

Specific details of other embodiments are included in the detailed description and drawings.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Hereinafter, embodiments of the inventive concept will now be described with reference to the accompanying drawings.

Figure 1:
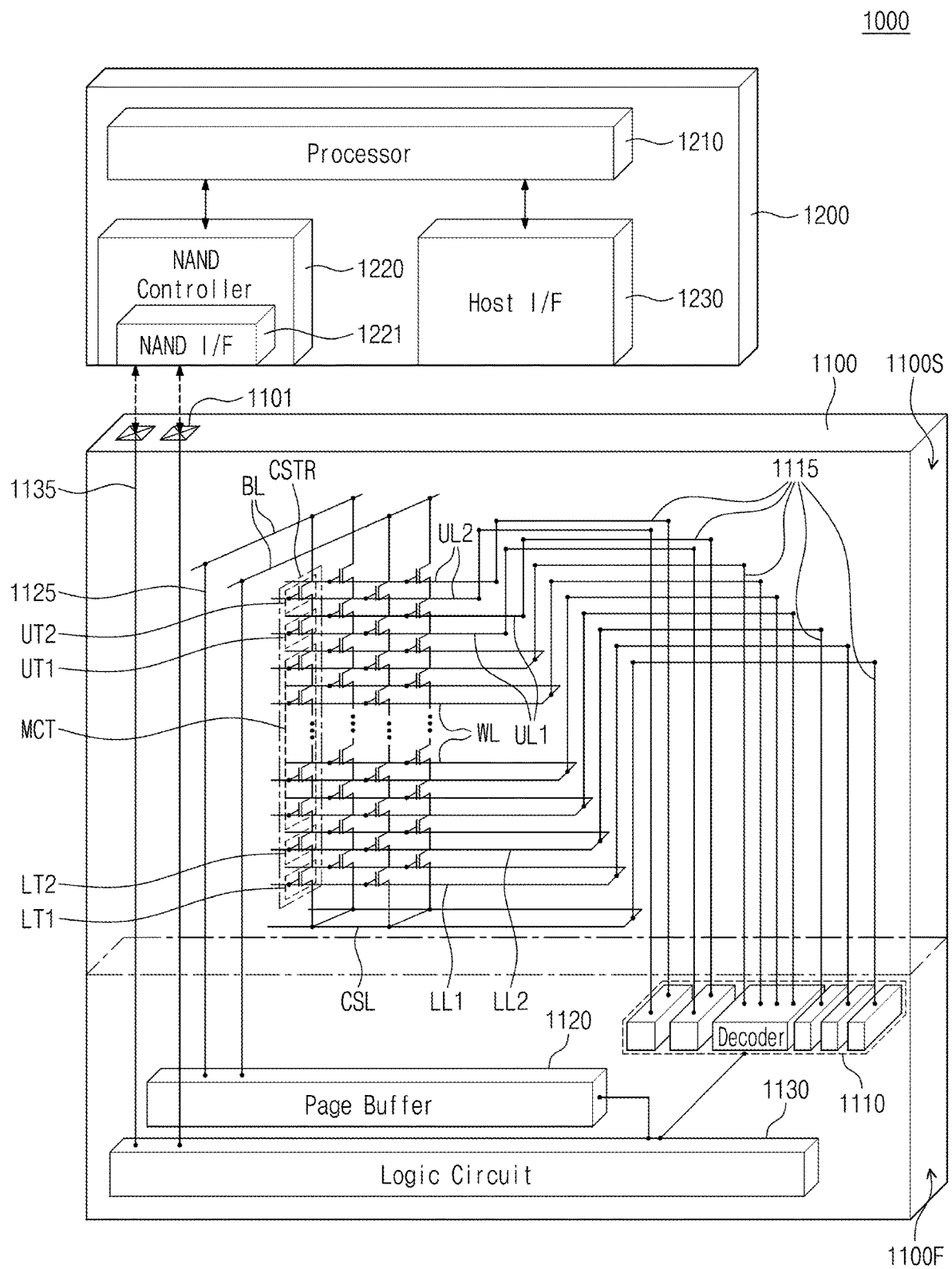
FIG. 1 is a diagram schematically illustrating an electronic system including a semiconductor device according to an embodiment of the inventive concept.

FIG. 1 is a diagram schematically illustrating an electronic system including a semiconductor device according to an embodiment of the inventive concept.

Referring to FIG. 1, an electronic system 1000 according to an embodiment of the inventive concept may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system may be a physical interconnection of components and/or parts that gathers various amounts of information together, processes/stores information/data, and/or performs various commands. For example, the electronic system 1000 may be a solid state drive (SSD) device, a universal serial bus (USB), a computing system, a medical device, or a communication device, which includes one or a plurality of semiconductor devices 1100.

As used herein, components described as being "electrically connected" are configured such that an electrical signal can be transferred from one component to the other (although such electrical signal may be attenuated in strength as it transferred and may be selectively transferred).

The semiconductor device 1100 may be a non-volatile memory device, for example, a NAND flash memory device. The semiconductor device 1100 may include a first structure 1100F and a second structure 1100S on the first structure 1100F. In embodiments, the first structure 1100F may be disposed next to the second structure 1100S.

The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit lines BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to embodiments.

In embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used in an erase operation for erasing data stored in the memory cell transistors MCT using a gate induce drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115 extending to the second structure 1100S from the first structure 1100F. The bit lines BL may be electrically connected to the page buffer 1120 through second connection lines 1125 extending to the second structure 1100S from the first structure 1100F.

In the first structure 1100F, the decoder circuit 1110, and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 extending to the second structure 1100S in the first structure 1100F.

Although not shown in the drawings, the first structure 1100F may include a voltage generator (not shown). The voltage generator may generate a program voltage, a read voltage, a pass voltage, and a verification voltage, which are required for operation of the memory cell strings CSTR. Here, the program voltage may be a relatively high voltage (e.g., 20V to 40V) compared to the read voltage, the pass voltage, and the verification voltage.

In embodiments, the first structure 1100F may include high voltage transistors and low voltage transistors. The decoder circuit 1110 may include pass transistors connected to the word lines WL of the memory cell strings CSTR. The pass transistors may include high voltage transistors capable of withstanding a high voltage such as a program voltage applied to the word lines WL during a program operation. The page buffer 1120 may also include high voltage transistors capable of withstanding a high voltage.

The controller 1200 may include a processor 1210, a NAND controller 1220, and a host interface 1230. In embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may be operated by a firmware, and may control the NAND controller 1220 to access the semiconductor device 1100. The NAND controller 1220 may include a NAND interface 1221 that handles communication with the semiconductor device 1100. Through the NAND interface 1221, a control command for controlling the semiconductor device 1100, data to be written to the memory cell transistors MCT of the semiconductor device 1100, and data read from the memory cell transistors MCT of the semiconductor device 1100 may be transmitted. The host interface 1230 may provide a communication function between the electronic system 1000 and an external host. When receiving a control command from the external host through the host interface 1230, the processor 1210 may control the semiconductor device 1100 in response to the control command.

Figure 2:
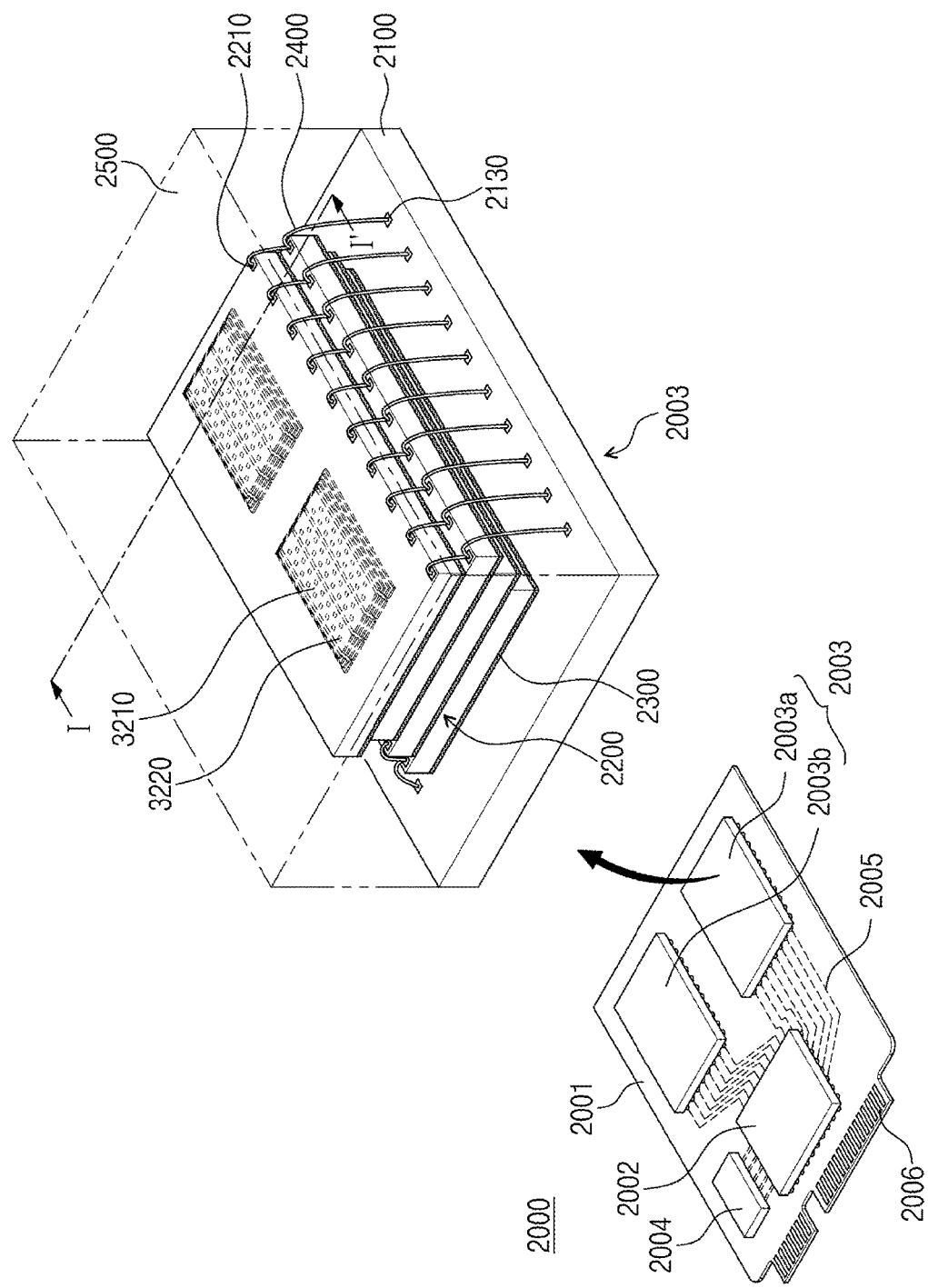
FIG. 2 is a perspective view schematically illustrating an electronic system including a semiconductor device according to an embodiment of the inventive concept.

FIG. 2 is a perspective view schematically illustrating an electronic system including a semiconductor device according to an embodiment of the inventive concept.

Referring to FIG. 2, an electronic system 2000 according to an embodiment of the inventive concept may include a main board 2001, a controller 2002 mounted on the main board 2001, and one or more semiconductor packages 2003, and DRAM 2004. The semiconductor package 2003 and the DRAM 2004 may be electrically connected to the controller 2002 by wiring patterns 2005 formed on the main board 2001.

The main board 2001 may include a connector 2006 including a plurality of pins configured to be coupled (e.g., electrically connected) to an external host. The number and arrangement of the plurality of pins in the connector 2006 may vary depending on a communication interface between the electronic system 2000 and the external host. In embodiments, the electronic system 2000 may communicate with an external host by one of interfaces such as Universal Serial Bus (USB), Peripheral Component Interconnect Express (PCI-Express), Serial Advanced Technology Attachment (SATA), and M-Phy for Universal Flash Storage (UFS). In embodiments, the electronic system 2000 may operate by power supplied from an external host through the connector 2006. The electronic system 2000 may further include a power management integrated circuit (PMIC) for distributing the power supplied from the external host to the controller 2002 and the semiconductor package 2003.

The controller 2002 may write data to the semiconductor package 2003 or read data from the semiconductor package 2003, and may improve the operating speed of the electronic system 2000.

The DRAM 2004 may be a buffer memory for mitigating a speed difference between the semiconductor package 2003, which is a data storage space, and an external host. The DRAM 2004 included in the electronic system 2000 may operate as a kind of cache memory, and may provide a space (or a function) for temporarily storing data in a control operation for the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, and adhesive layers 2300 disposed on lower surfaces of the semiconductor chips 2200, respectively, a connection structure 2400 electrically connecting the semiconductor chips 2200 and the package substrate 2100, and a molding layer 2500 covering the semiconductor chips 2200 and the connection structure 2400 on the package substrate 2100. For example, the molding layer 2500 may be formed on the package substrate 2100 and may enclose the semiconductor chips 2200 and the connection structure 2400.

The package substrate 2100 may be a printed circuit board including upper pads 2130. Each of the semiconductor chips 2200 may include an input/output pad 2210. The input/output pad 2210 may correspond to the input/output pad 1101 of FIG. 1. For example, the input/output pad 2210 may be the same as the input/output pad 1101 of FIG. 1 in functional aspects and/or in structural aspects. Each of the semiconductor chips 2200 may include stacked structures 3210 and vertical structures 3220. Each of the semiconductor chips 2200 may include a semiconductor device according to embodiments described below.

In embodiments, the connection structure 2400 may be a bonding wire electrically connecting the input/output pad 2210 and the upper pads 2130. Accordingly, in each of the first and second semiconductor packages 2003a and 2003b, the semiconductor chips 2200 may be electrically connected to each other by a bonding wire method, and may be electrically connected to the upper pads 2130 of the package substrate 2100. According to embodiments, in each of the first and second semiconductor packages 2003a and 2003b, the semiconductor chips 2200 may be electrically connected to each other by a through silicon via (TSV) instead of the bonding wire-type connection structure 2400.

In embodiments, the controller 2002 and the semiconductor chips 2200 may be included in one package. In an embodiment, the controller 2002 and the semiconductor chips 2200 may be mounted on a separate interposer substrate different from the main substrate 2001, and the controller 2002 and the semiconductor chips 2200 may be connected to each other by wirings formed on the interposer substrate. For example, the separate interposer substrate may be mounted on the main substrate 2001.

Figure 3:
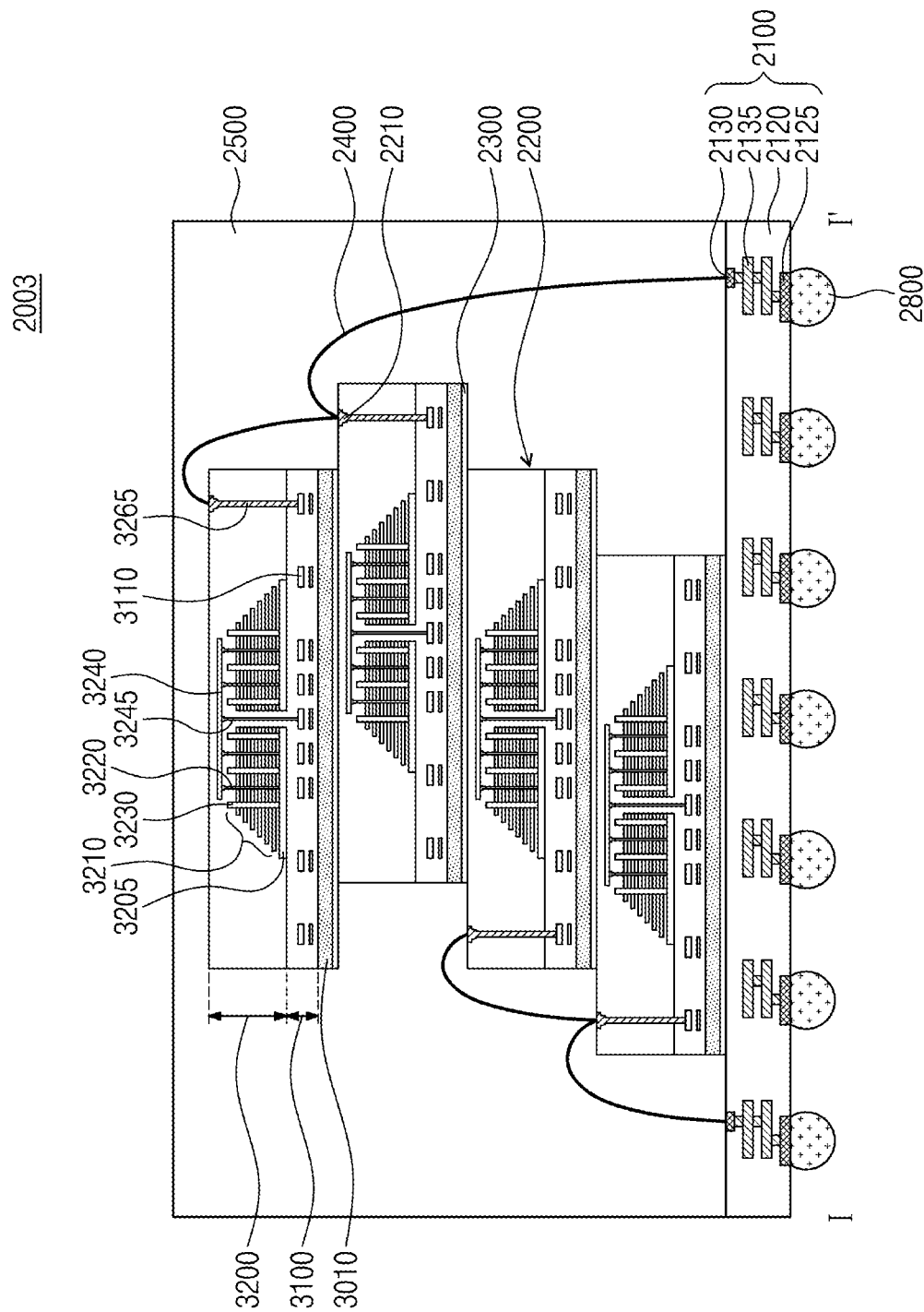
FIGS. 3 and 4 are cross-sectional views schematically illustrating semiconductor packages according to an embodiment of the inventive concept.
Figure 4:
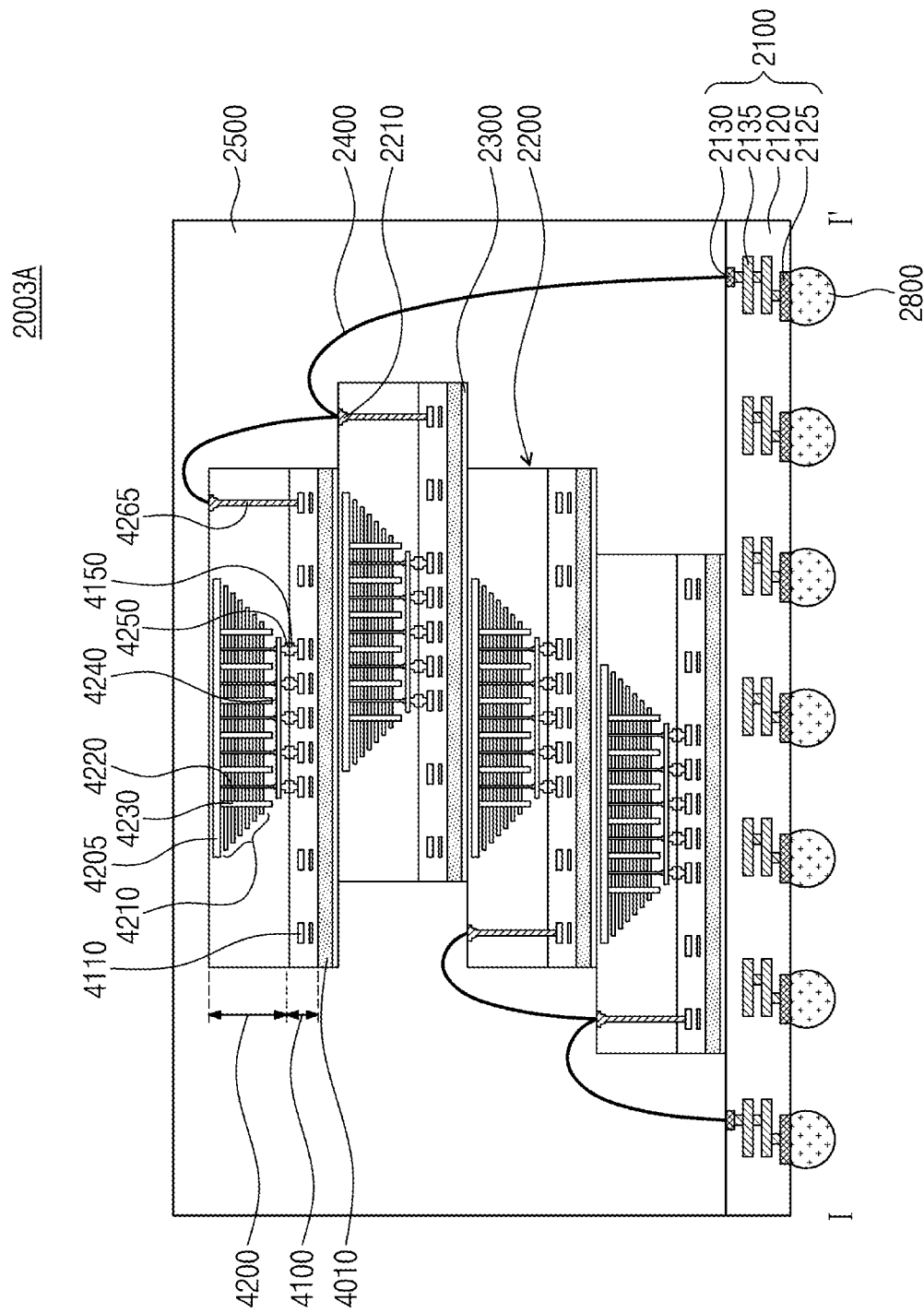

FIGS. 3 and 4 are cross-sectional views schematically illustrating semiconductor packages according to embodiments of the inventive concept. FIGS. 3 and 4 describe embodiments of the semiconductor package of FIG. 2, respectively, and conceptually represent a region cut along line I-I' of the semiconductor package of FIG. 2.

Referring to FIG. 3, in the semiconductor package 2003, the package substrate 2100 may be a printed circuit board. The package substrate 2100 may include a package substrate body 2120, upper pads 2130 disposed on a top surface of the package substrate body 2120, lower pads 2125 disposed on or exposed through a bottom surface of the package substrate body 2120, and internal wirings 2135 electrically connecting the upper pads 2130 and the lower pads 2125 in the package substrate body 2120. The upper pads 2130 may be electrically connected to the connection structures 2400. The lower pads 2125 may be electrically connected to the wiring patterns 2005 of the main board 2010 of the electronic system 2000 as shown in FIG. 2 through conductive connectors 2800.

Each of the semiconductor chips 2200 may include a semiconductor substrate 3010, and a first structure 3100 and a second structure 3200 that are sequentially stacked on the semiconductor substrate 3010. The first structure 3100 may include a peripheral circuit region including peripheral wirings 3110. The second structure 3200 may include a source structure 3205, a stacked structure 3210 on the source structure 3205, vertical structures 3220 and separation structures 3230 passing through the stacked structure 3210, bit lines 3240 electrically connected to the vertical structures 3220, and cell contact plugs electrically connected to word lines (WL of FIG. 1) of the stacked structure 3210. Each of the first structure 3100/second structure 3200/semiconductor chips 2200 may further include separation structures to be described later.

Each of the semiconductor chips 2200 may include a through wiring 3245 electrically connected to the peripheral wirings 3110 of the first structure 3100 and extending into the second structure 3200. The through wiring 3245 may be disposed outside the stacked structure 3210 and may be further disposed to pass through the stacked structure 3210. Stacked structures in the present disclosure may also be called stack structures. Each of the semiconductor chips 2200 may further include an input/output interconnection wiring 3265 electrically connected to the peripheral wirings 3110 of the first structure 3100 and extended in the second structure 3200, and an input/output pad 2210 electrically connected to the input/output interconnection wiring 3265. For example, the input/output interconnection wiring 3265 may extend in a vertical direction from the first structure 3100 through the second structure 3200 to contact the input/output pad 2210.

Referring to FIG. 4, in a semiconductor package 2003A, each of the semiconductor chips 2200 may include a semiconductor substrate 4010, a first structure 4100 on the semiconductor substrate 4010, and a second structure 4200 on the first structure 4100, which is bonded to the first structure 4100 by a wafer bonding method.

The first structure 4100 may include a peripheral circuit region including the peripheral wiring 4110 and the first bonding structures 4150. The second structure 4200 may include a source structure 4205, a stacked structure 4210 between the source structure 4205 and the first structure 4100, vertical structures 4220 and a separation structure 4230 passing through the stacked structure 4210, and second bonding structures 4250 electrically connected to the vertical structures 4220 and the word lines (WL of FIG. 1) of the stacked structure 4210, respectively. For example, the second bonding structures 4250 may be electrically connected to the vertical structures 4220 and the word lines (WL of FIG. 1), respectively, through cell contact plugs electrically connected to bit lines 4240 and the word lines (WL of FIG. 1) electrically connected to the vertical structures 4220. The first bonding structures 4150 of the first structure 4100 and the second bonding structures 4250 of the second structure 4200 may be bonded while being in contact with each other. Bonded portions of the first bonding structures 4150 and the second bonding structures 4250 may be formed of, for example, copper (Cu).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Each of the semiconductor chips 2200 may further include an input/output pad 2210 and an input/output interconnection wiring 4265 under the input/output pad 2210. The input/output interconnection wiring 4265 may be electrically connected to the peripheral wirings 4110 of the first structure 4100.

The semiconductor chips 2200 of FIG. 3 or the semiconductor chips 2200 of FIG. 4 may be electrically connected to each other by connection structures 2400 in the form of bonding wires. However, in embodiments, the semiconductor chips 2200 in one semiconductor package including the semiconductor chips 2200 of FIG. 3 or the semiconductor chips 2200 of FIG. 4 may be electrically connected to each other by a connection structure including a through silicon via (TSV).

The first structure 3100 of FIG. 3 and the first structure 4100 of FIG. 4 may correspond to a peripheral circuit structure in the embodiments described below, and the second structure 3200 of FIG. 3 and the second structure 4200 of FIG. 4 may correspond to a cell array structure in the embodiments described below.

Figure 5A:
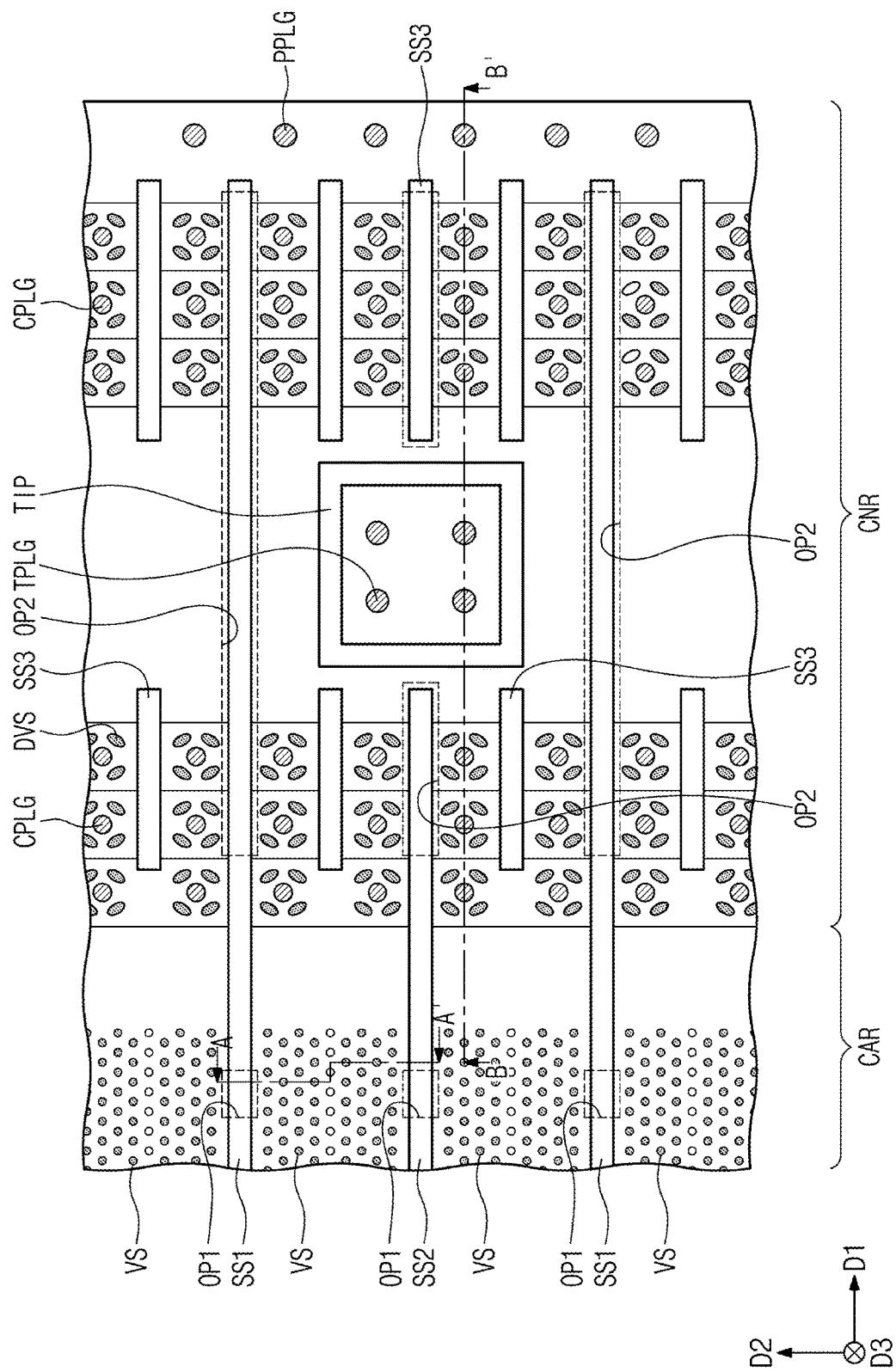
FIG. 5A is a plan view of a semiconductor device according to an embodiment of the inventive concept.
Figure 5B:
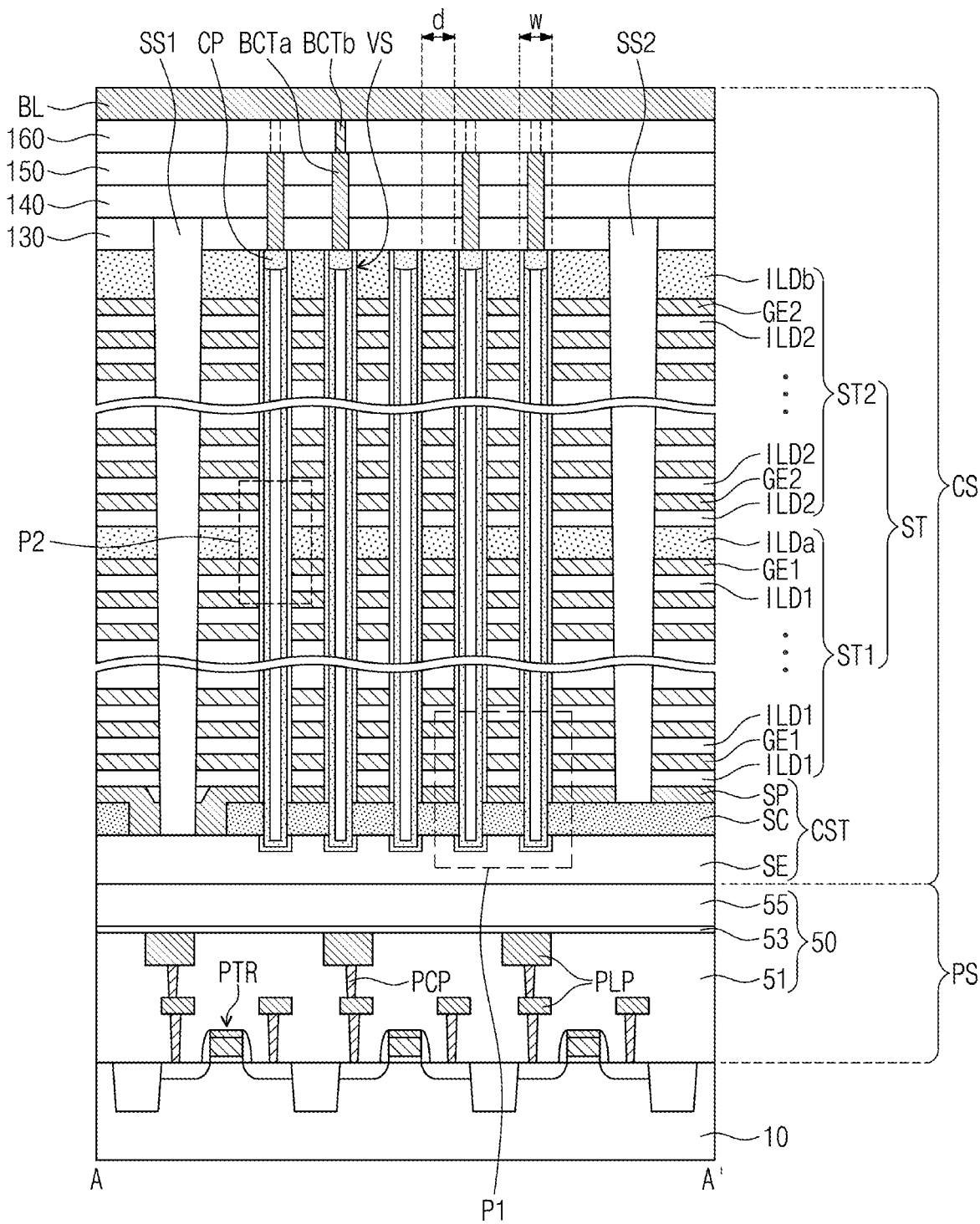
FIG. 5B is a cross-sectional view of a semiconductor device according to an embodiment of the inventive concept and is a cross-sectional view taken along line A-A' of FIG. 5A.
Figure 6A:
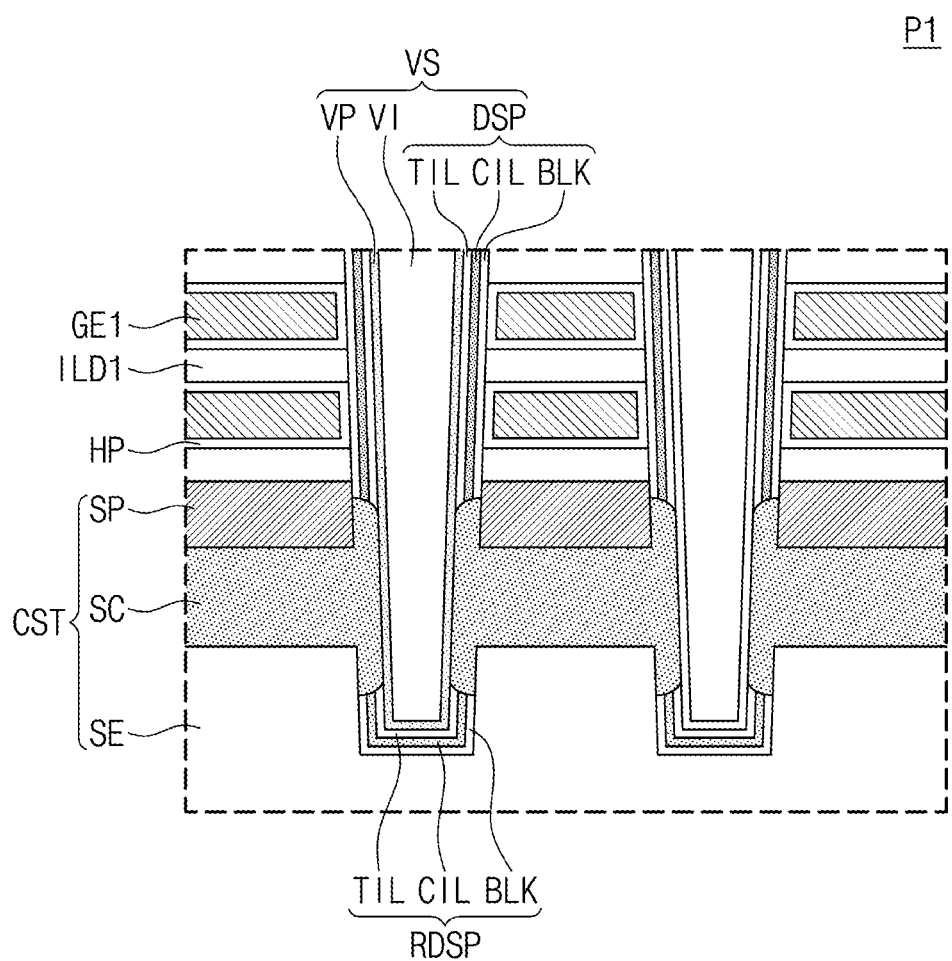
FIG. 6A is an enlarged view of P1 of FIG. 5B.
Figure 6B:
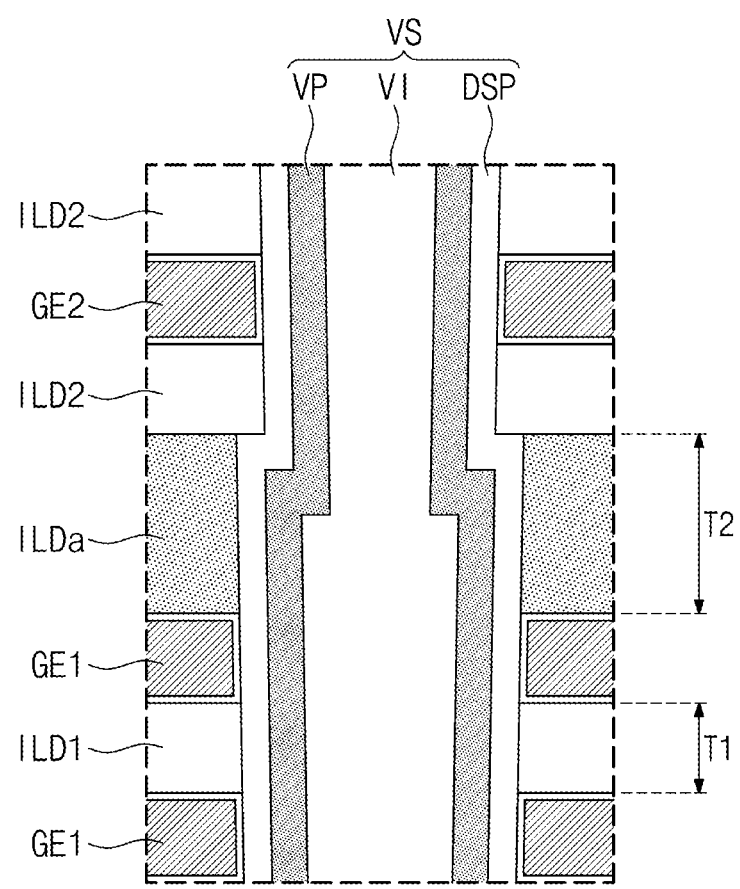
FIG. 6B is an enlarged view of P2 of FIG. 5B.

FIG. 5A is a plan view of a semiconductor device according to an embodiment of the inventive concept. FIG. 5B is a cross-sectional view of a semiconductor device according to an embodiment of the inventive concept and is a cross-sectional view taken along line A-A' of FIG. 5A. FIG. 6A is an enlarged view of P1 of FIG. 5B. FIG. 6B is an enlarged view of P2 of FIG. 5B.

Referring to FIGS. 5A and 5B, a semiconductor device may include a semiconductor substrate 10, and a peripheral circuit structure PS and a cell array structure CS sequentially stacked on the semiconductor substrate 10.

The peripheral circuit structure PS may include peripheral circuits PTR integrated on a front surface of the semiconductor substrate 10 and a peripheral circuit insulating layer 50 covering the peripheral circuits PTR. The semiconductor substrate 10 may be a silicon substrate. The semiconductor substrate 10 may include a cell array region CAR and a connection region CNR.

The peripheral circuits PTR may be row and column decoders, a page buffer, and/or a control circuit. For example, the peripheral circuits PTR may include NMOS and PMOS transistors. Peripheral circuit wirings PLP may be electrically connected to the peripheral circuits PTR through peripheral contact plugs PCP.

The peripheral circuit insulating layer 50 may be provided on the front surface of the semiconductor substrate 10. The peripheral circuit insulating layer 50 may cover the peripheral circuits PTR, the peripheral contact plugs PCP, and the peripheral circuit wirings PLP on the semiconductor substrate 10. The peripheral contact plugs PCP and the peripheral circuit wirings PLP may be electrically connected to the peripheral circuits PTR.

The peripheral circuit insulating layer 50 may include or be formed of a plurality of insulating layers stacked in a vertical direction. For example, the peripheral circuit insulating layer 50 may include a silicon oxide layer, a silicon nitride layer, a silicon oxynitride layer, and/or a low-k layer. For example, the peripheral circuit insulating layer 50 may include a first lower insulating layer 51, a second lower insulating layer 55, and an etch stop layer 53 between the first and second lower insulating layers 51 and 55. The etch stop layer 53 may include or be formed of an insulating material different from an insulating material of each of the first and second lower insulating layers 51 and 55, and may cover/contact top surfaces of the uppermost peripheral circuit wirings PLP.

The cell array structure CS may be disposed on the peripheral circuit insulating layer 50. The cell array structure CS may include a source structure CST, a stacked structure ST, vertical structures VS, cell contact plugs CPLG, through contact plugs TPLG, and the bit lines BL.

The source structure CST may be disposed between the peripheral circuit insulating layer 50 and the stacked structure ST. The source structure CST may extend in a first direction D1 in parallel to the stacked structure ST in the cell array region CAR and the connection region CNR. The source structure CST may include a semiconductor layer SE, a source conductive pattern SC, and a support conductive pattern SP on the source conductive pattern SC.

According to embodiments, cell strings CSTR shown in FIG. 1 may be integrated on the semiconductor layer SE. The stacked structure ST and the vertical structures VS may constitute the cell strings CSTR shown in FIG. 1.

For example, the semiconductor layer SE may be disposed on a top surface of the peripheral circuit insulating layer 50. The semiconductor layer SE may be formed of a semiconductor material, an insulating material, or a conductive material. The semiconductor layer SE may include a semiconductor doped with dopants having a first conductivity type (e.g., n-type) and/or an intrinsic semiconductor undoped with impurities. For example, the semiconductor layer SE may include or be formed of doped polysilicon, undoped polysilicon, metal, conductive metal nitride, conductive metal silicide, conductive metal oxide, or a combination thereof. The semiconductor layer SE may have a crystal structure including at least one selected from single crystal, amorphous, and polycrystalline. For example, doped materials/layers may be materials/layers in which impurities are intentionally introduced into the materials/layers, and undoped materials/layers may be materials/layers in which no impurity is intentionally introduced into the materials/layers even though some impurities may be unintentionally introduced into the materials/layers. For example, in doped materials/layers the impurities may range between $10^{-6}\%$ and $10^{-2}\%$ of the total constituent of the materials/layers.

The source conductive pattern SC may be disposed between the semiconductor layer SE and the stacked structure ST in the cell array region CAR. The source conductive pattern SC may be formed of a semiconductor material doped with dopants having a first conductivity type (e.g., phosphorus (P) or arsenic (As)). For example, the source conductive pattern SC may be formed of a polysilicon layer doped with n-type dopants.

The support conductive pattern SP may cover a top surface of the source conductive pattern SC in the cell array region CAR. The support conductive pattern SP may include a semiconductor doped with dopants having a first conductivity type (e.g., n-type) and/or an intrinsic semiconductor undoped with impurities. For example, the support conductive pattern SP may be formed of a polysilicon layer doped with n-type dopants, and may have an n-type dopant concentration lower than an n-type dopant concentration of the source conductive pattern SC.

Some parts of the support conductive pattern SP may pass through the source conductive pattern SC, e.g., in a vertical direction, to be in contact with the semiconductor layer SE. For example, the parts of the support conductive pattern SP may be disposed in first and second openings OP1 and OP2 formed in the source conductive pattern SC.

Spatially relative terms, such as "beneath," "below," "lower," "above," "upper," "vertical," "horizontal," and the like, may be used herein for ease of description to describe positional relationships. It will be understood that the spatially relative terms encompass different orientations of the device in addition to the orientation depicted in the figures.

The stacked structure ST may be disposed on the source structure CST. The stacked structure ST may extend from the cell array region CAR to the connection region CNR in the first direction D1, and may have a stepped structure in the connection region CNR.

The stacked structure ST may include electrodes GE1 and GE2 and interlayer insulating layers ILD1 and ILD2, which are alternately stacked along a third direction D3 (i.e., a vertical direction) perpendicular to the first and second directions D1 and D2 intersecting each other. The electrodes GE1 and GE2 may include or be formed of, for example, at least one selected from doped semiconductors (e.g., doped silicon, etc.), metal (e.g., tungsten, copper, aluminum, etc.), conductive metal nitride (e.g., titanium nitride, tantalum nitride, etc.) or transition metals (e.g., titanium, tantalum, etc.). The interlayer insulating layers ILD1 and ILD2 may include or be formed of a silicon oxide layer and/or a low dielectric layer. In some embodiments, the semiconductor device may be a vertical NAND flash memory device. In this case, the electrodes GE1 and GE2 of the stacked structure ST may be used as the gate lower lines LL1 and LL2, the word lines WL, and the gate upper lines UL1 and UL2, described with reference to FIG. 1.

According to an embodiment, the stacked structure ST may include a first stacked structure ST1 and a second stacked structure ST2 disposed on the first stacked structure ST1. The first stacked structure ST1 may include first electrodes GE1 and first interlayer insulating layers ILD1 which are alternately stacked on the semiconductor layer SE in the third direction D3, and a first upper insulating layer ILDa covering the uppermost first electrode GE1 among the first electrodes GE1. The second stacked structure ST2 may include second electrodes GE2 and second interlayer insulating layers ILD2 which are alternately stacked on the first stacked structure ST1 in the third direction D3, and a second upper insulating layer ILDb covering the uppermost second electrode GE2 among the second electrodes GE2.

In embodiments, the first and second upper insulating layers ILDa and ILDb may include or be formed of an insulating material different from an insulating material of the first and second interlayer insulating layers ILD1 and ILD2. The first and second upper insulating layers ILDa and ILDb may be doped with impurities, and the first and second interlayer insulating layers ILD1 and ILD2 may be undoped with impurities.

The first and second upper insulating layers ILDa and ILDb may include or be formed of silicon oxide doped with impurities, and each of the first and second interlayer insulating layers ILD1 and ILD2 may include or be formed of undoped oxide, e.g., undoped silicon oxide.

For example, in the first stacked structure ST1, the first interlayer insulating layers ILD1 and the first upper insulating layer ILDa may be formed of silicon oxide, and impurities concentration in the first upper insulating layer ILDa may be greater than impurities concentration in each of the first interlayer insulating layers ILD1. In the second stacked structure ST2, the second interlayer insulating layers ILD2 and the second upper insulating layer ILDb may be formed of silicon oxide, and impurities concentration in the second upper insulating layer ILDb may be greater than impurities concentration in each of the second interlayer insulating layers ILD2.

In some embodiments, impurities in the first and second upper insulating layers ILDa and ILDb may include nitrogen or phosphorous. An impurities concentration in each of the first and second upper insulating layers ILDa and ILDb may be substantially uniform, e.g., throughout the respective first and second upper insulating layers ILDa and ILDb. For example, the first and second upper insulating layers ILDa and ILDb may be formed of silicon oxynitride.

Terms such as "same," "equal," "planar," "uniform," or "coplanar," as used herein encompass identicality or near identicality including variations that may occur, for example, due to manufacturing processes. The term "substantially" may be used herein to emphasize this meaning, unless the context or other statements indicate otherwise.

Referring to FIG. 6B, in the first stacked structure ST1, each of the first interlayer insulating layers ILD1 may have a first thickness T1, and the first upper insulating layer ILDa may have a second thickness T2 greater than the first thickness T1. For example, the thickness of the first upper insulating layer ILDa may be about 2 to 3 times greater than a thickness of each first interlayer insulating layer ILD1.

Similarly, in the second stacked structure ST2, a thickness of the second upper insulating layer ILDb may be greater than a thickness of each second interlayer insulating layer ILD2. In addition, the thickness of the second upper insulating layer ILDb may be greater than or substantially the same as the second thickness T2 of the first upper insulating layer ILDa. For example, the thickness of the second upper insulating layer ILDb may be about 2 to 3 times greater than a thickness of each second interlayer insulating layer ILD2.

The plurality of vertical structures VS may pass through the stacked structure ST and the source structure CST in the cell array region CAR. The vertical structures VS may be arranged in one direction (e.g., in a line) or arranged in a zigzag manner, in a plan view. Dummy vertical structures DVS may pass through the stacked structure ST in the connection region CNR. The dummy vertical structures DVS may pass through pads of the electrodes GE1 and GE2, and may have substantially the same structure as the vertical structures VS. For example, the dummy vertical structures DVS may have identical structures to the vertical structures VS.

For example, referring to FIG. 6A, each of the vertical structures VS may include a vertical semiconductor pattern VP, a data storage pattern DSP surrounding a sidewall of the vertical semiconductor pattern VP, and a gap-fill insulating pattern VI inside the vertical semiconductor pattern VP. For example, the data storage pattern DSP may be formed on an outer sidewall of the vertical semiconductor pattern VP, and the gap-fill insulating pattern VI may be formed on an inner sidewall of the vertical semiconductor pattern VP.

For example, the vertical semiconductor pattern VP may have a closed pipe shape or a macaroni shape. The vertical semiconductor pattern VP may have a U-shape (e.g., in a cross-sectional view), and the inside thereof may be filled with the gap-fill insulating pattern VI. A bit line conductive pad CP may be formed on the vertical semiconductor pattern VP (e.g., on top of the vertical semiconductor pattern VP), and the bit line conductive pad CP may be formed of an undoped semiconductor material, a semiconductor material doped with impurities, or a conductive material.

The vertical semiconductor pattern VP may include a semiconductor material such as silicon (Si), germanium (Ge), or a mixture thereof. The vertical semiconductor pattern VP including a semiconductor material may be used as channels of the upper transistors UT1 and UT2, the memory cell transistors MCT, and the lower transistors LT1 and LT2 described with reference to FIG. 1.

The data storage pattern DSP may extend in the third direction D3 and surround the sidewall of the vertical semiconductor pattern VP. For example, the data storage pattern DSP may surround the vertical semiconductor pattern VP and may contact a sidewall of the vertical semiconductor pattern VP. For example, the vertical semiconductor pattern VP may be used as a vertical channel pattern of the upper and lower transistors UT1, UT2, LT1, and LT2. The data storage pattern DSP may be in a pipe form with upper and lower ends open or in a macaroni shape. The data storage pattern DSP may include one thin layer or a plurality of thin layers. In embodiments of the inventive concept, the data storage pattern DSP may be a data storage layer of the NAND flash memory device, and may include a tunnel insulating layer TIL, a charge storage layer CIL, and a blocking insulating layer BLK, which are sequentially stacked on the sidewall of the vertical semiconductor pattern VP. For example, the charge storage layer CIL may be a trap insulating layer, a floating gate electrode, or an insulating layer including conductive nano dots. A residual data storage pattern RDSP may be vertically spaced apart from the data storage pattern DSP and disposed in the semiconductor layer SE. The residual data storage pattern RDSP may have the same thin layer structure as the data storage pattern DSP.

A horizontal insulating pattern HP may be provided between one of sidewalls of the electrodes GE1 and GE2 and the data storage pattern DSP. The horizontal insulating pattern HP may extend from the one of the sidewalls of the electrodes GE1 and GE2 to top and bottom surfaces thereof.

A part of the sidewall of the vertical semiconductor pattern VP of each vertical structure VS may be in contact with the source semiconductor pattern SC. In each vertical structure VS, a bottom surface of the data storage pattern DSP may be disposed at a level lower than a bottom surface of the lowest electrode GE1 and may be disposed at a level higher than a top surface of the source semiconductor pattern SC. For example, a bottom surface of the data storage pattern DSP may contact a top surface of the source semiconductor pattern SC as shown in FIG. 6A.

Referring to FIGS. 5A and 5B, the top surfaces of the vertical structures VS may be coplanar with a top surface of the second upper insulating layer ILDb. Each of the vertical structures VS may have a maximum width at a vertical level of the top surface of the second upper insulating layer ILDb. For example, each of the vertical structures VS may have its greatest width in a horizontal direction on the top surface of the vertical structure VS. Each of the vertical structures VS may have a minimum width at the bottom surface thereof, and the minimum width may be smaller than the maximum width. For example, each of the vertical structures VS may have its least width in a horizontal direction at the bottom surface of the vertical structure VA. Alternatively, each of the vertical structures VS may have substantially the same width at the top surface thereof as the width at the bottom surface thereof. A distance "d" between adjacent vertical structures VS may be smaller than the maximum width "w" of each of the vertical structures VS.

In embodiments, each of the vertical structures VS may include a first vertical extension passing through the first stacked structure ST1 and a second vertical extension passing through the second stacked structure ST2, as shown in FIG. 6B. The first vertical extension and the second vertical extension may have a single structure continuously extending without an interface. Here, the first vertical extension may have a sidewall having a uniform slope from bottom to top thereof. Likewise, the second vertical extension may have a sidewall having a uniform slope from bottom to top thereof. A lower width of the second vertical extension may be shorter than an upper width of the first vertical extension as shown in FIG. 6B.

A first planar insulating layer 130 may cover top surfaces of the vertical structures VS on the stacked structure ST. The first planar insulating layer 130 may cover the top surface of the second upper insulating layer ILDb. The first planar insulating layer 130 may be formed of the same insulating material as an insulating material of the second upper insulating layer ILDb, or may be formed of the same insulating material as an insulating material of the first and second interlayer insulating layers ILD1 and ILD2.

First, second, and third separation structures SS1, SS2, and SS3 may pass through the first planar insulating layer 130 and the stacked structure ST on the semiconductor layer SE. Each of the first, second, and third separation structures SS1, SS2, and SS3 may include an insulating layer covering a sidewall of the stacked structure ST. Each of the first, second, and third separation structures SS1, SS2, and SS3 may have a single-layer or multi-layer structure.

The first separation structures SS1 may extend from the cell array region CAR to the connection region CNR side by side in the first direction D1, and may be spaced apart from one another in the second direction D2 crossing the first direction D1. The first separation structures SS1 may pass through the part of the support conductive pattern/layer SP filled in the first opening OP1 in the cell array region CAR. The first separation structures SS1 may be in contact with the semiconductor layer SE in the cell array region CAR, e.g., in the first opening OP1.

The second separation structure SS2 may pass through the stacked structure ST in the cell array region CAR. The second separation structure SS2 may be in contact with the source conductive pattern SC. The second separation structure SS2 may be disposed between the first separation structures SS1. In the first direction D1, a length of the second separation structure SS2 may be smaller than a length of the first separation structure SS1. As another example, a plurality of second separation structures SS2 may be provided between the first separation structures SS1.

Second, third, and fourth planar insulating layers 140, 150, and 160 may be sequentially stacked on the first planar insulating layer 130. The second, third, and fourth planar insulating layers 140, 150, and 160 may include or be formed of an insulating material such as silicon oxide, silicon nitride, silicon oxynitride, or a low-k material.

The bit lines BL may be disposed on the fourth planar insulating layer 160 in the cell array region CAR. Although the bit lines are omitted from plan views, the bit lines BL may extend in the second direction D2 across the stacked structure ST. The bit lines BL may be electrically connected to the vertical structures VS through lower and upper bit line contact plugs BCTa and BCTb.

FIGS. 7 to 13 are views for illustrating a method of manufacturing a semiconductor device according to an embodiment of the inventive concept and show cross-sections taken along line A-A' of FIG. 5A.

Figure 7:
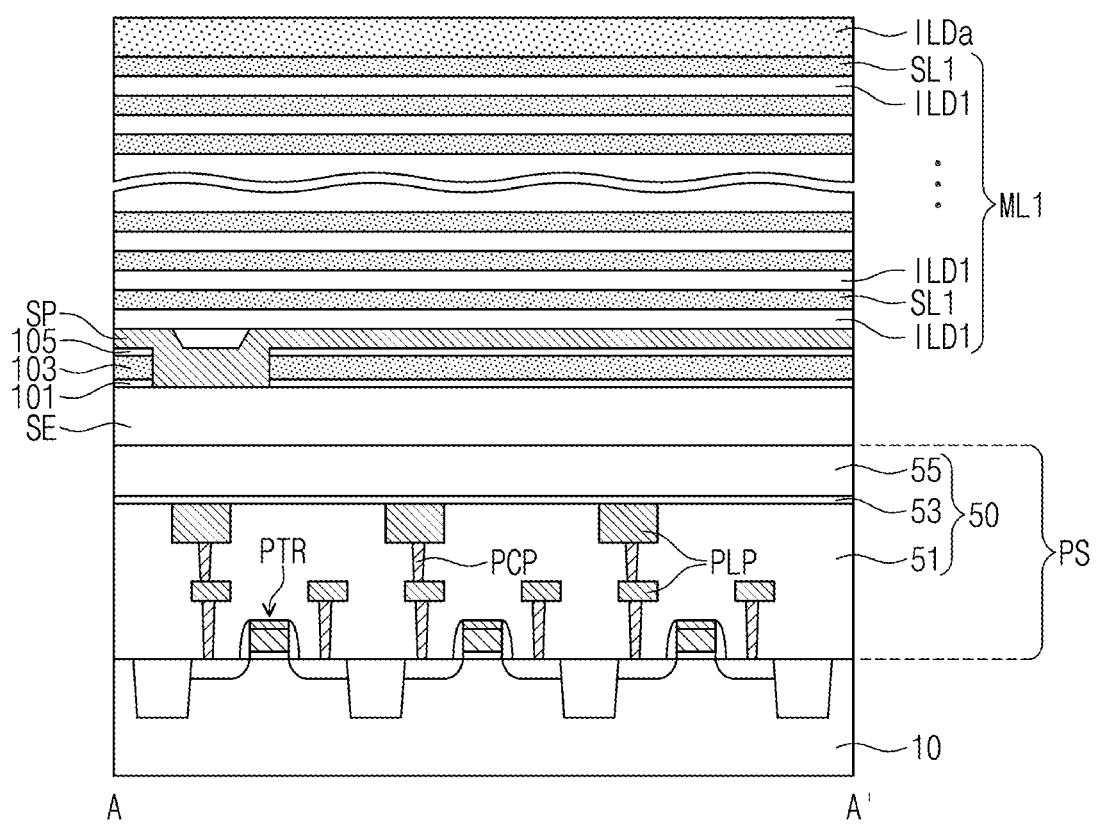
FIGS. 7 to 13 are views for illustrating a method of manufacturing a semiconductor device according to an embodiment of the inventive concept and show cross-sections taken along line A-A' of FIG. 5A.

Referring to FIGS. 5A and 7, a peripheral circuit structure PS may be formed on a semiconductor substrate 10.

The forming of the peripheral circuit structure PS may include forming peripheral circuits PTR on the semiconductor substrate 10, forming peripheral wire structures PCP and PLP connected to the peripheral circuits PTR, and forming a peripheral circuit insulating layer 50.

Row and column decoders, page buffers, and control circuits may be formed on the semiconductor substrate 10 as the peripheral circuits PTR. Here, the peripheral circuits PTR may include MOS transistors using the semiconductor substrate 10 as a channel.

The peripheral circuit insulating layer 50 may include or be formed of one insulating layer or a plurality of stacked insulating layers covering the peripheral circuits PTR. The peripheral circuit insulating layer 50 may include a first lower insulating layer 51, a second lower insulating layer 55, and an etch stop layer 53 between the first and second lower insulating layers 51 and 55. The peripheral circuit insulating layer 50 may include, for example, a silicon oxide layer, a silicon nitride layer, a silicon oxynitride layer, and/or a low-k layer.

The forming of the peripheral wire structures PCP and PLP may include forming the peripheral contact plugs PCP passing through some of the peripheral circuit insulating layer 50 and forming the peripheral circuit wirings PLP electrically connected to and/or contact the peripheral contact plugs PCP.

Subsequently, a semiconductor layer SE may be formed on the peripheral circuit insulating layer 50. The semiconductor layer SE may be formed by depositing a semiconductor material, e.g., on the second lower insulating layer 55. The semiconductor layer SE may, for example, include or be formed of at least one of silicon (Si), germanium (Ge), silicon germanium (SiGe), gallium arsenide (GaAs), indium gallium arsenide (InGaAs), aluminum gallium arsenide (AlGaAs), or a mixture thereof. The semiconductor layer SE may include a semiconductor doped with impurities and/or an intrinsic semiconductor undoped with impurities. The semiconductor layer SE may include a crystal structure including at least one selected from single crystal, amorphous, and polycrystalline. The semiconductor layer SE may include a metal such as tungsten, a conductive metal nitride, a conductive metal silicide, a conductive metal oxide, or a combination thereof.

A first insulating layer 101, a second insulating layer 103, and a third insulating layer 105 may be sequentially stacked on the semiconductor layer SE. The first insulating layer 101 may be formed by thermally oxidizing the surface of the semiconductor layer SE or may be formed by depositing a silicon oxide layer. For example, the first insulating layer 101 may be a silicon oxide layer. The second insulating layer 103 may be formed of a material having etch selectivity with respect to the first insulating layer 101 and the third insulating layer 105. For example, the second insulating layer 103 may be at least one of a silicon nitride layer, a silicon oxynitride layer, silicon carbide, and silicon germanium. The third insulating layer 105 may be formed by depositing a silicon oxide layer, e.g., on the second insulating layer 103. For example, the third insulating layer 105 may be a silicon oxide layer.

The first insulating layer 101, second insulating layer 103, and the third insulating layer 105 may be patterned to form first openings OP1 exposing parts of the semiconductor layer SE in the cell array region CAR. At the same time, second openings OP2 exposing parts of the semiconductor layer SE may be formed in the connection region CNR.

The forming of the first and second openings OP1 and OP2 may include forming a mask pattern (not shown) exposing the parts of the connection region CNR and the cell array region CAR, and etching the first, second, and third insulating layers 101, 103, and 105 using the mask pattern as an etching mask to expose the first insulating layer 101 or the semiconductor layer SE. After the first and second openings OP1 and OP2 are formed, the mask pattern may be removed.

After the first and second openings OP1 and OP2 are formed, a support conductive layer SP may be deposited on the third insulating layer 105 to have a uniform thickness. The support conductive layer SP may fill the first and second openings OP1 and OP2 of the first insulating layer 101, the second insulating layer 103, and the third insulating layer 105, in the cell array region CAR. The support conductive layer SP may be in contact with the semiconductor layer SE, directly, in the first and second openings OP1 and OP2. The support conductive layer SP may be a polysilicon layer doped with n-type dopants and/or carbon (C).

Subsequently, a first mold structure ML1 may be formed on the support conductive layer SP.

The forming of the first mold structure ML1 may include vertically alternately stacking first interlayer insulating layers ILD1 and first sacrificial layers SL1, and forming a first upper insulating layer ILDa on the uppermost first sacrificial layer SL1.

In the first mold structure ML1, the first sacrificial layers SL1 may be formed of a material capable being etched having etch selectivity with respect to the first interlayer insulating layers ILD1 and the first upper insulating layer ILDa. For example, the first sacrificial layers SL1 may be formed of an insulating material different from an insulating material of the first interlayer insulating layers ILD1 and the first upper insulating layer ILDa. The first sacrificial layers SL1 may be formed of the same material as the second insulating layer 103. For example, the first sacrificial layers SL1 may be formed of a silicon nitride layer, and the first interlayer insulating layers ILD1 may be formed of an undoped silicon oxide. The first upper insulating layer ILDa may be formed of a silicon oxide layer doped with impurities. The impurities in the first upper insulating layer ILDa may include or may be nitrogen or phosphorus.

The first interlayer insulating layers ILD1, the first sacrificial layers SL1, and the first upper insulating layer ILDa may be deposited using a thermal chemical vapor deposition (CVD), a plasma enhanced chemical vapor deposition, a physical chemical vapor deposition or an atomic layer deposition (ALD) process. The first interlayer insulating layers ILD1, the first sacrificial layers SL1, and the first upper insulating layer ILDa may be deposited in-situ.

The first upper insulating layer ILDa may be deposited to be thicker than each of the first interlayer insulating layers ILD1. For example, the thickness of the first upper insulating layer ILDa may be about 2 to 3 times greater than a thickness of each first interlayer insulating layer ILD1. For example, the thickness of the first upper insulating layer ILDa may be between 2 and 3 times of a thickness of each first interlayer insulating layer ILD1.

In some embodiments, an impurity gas may be provided while the first upper insulating layer ILDa is deposited, and therefore impurities may be doped into the first upper insulating layer ILDa. Here, the impurity gas may include or may be NH3 or PH3. When depositing the first upper insulating layer ILDa, doped impurities (e.g., nitrogen or phosphorus) may break a bond between silicon (Si) and oxygen (O) in the first upper insulating layer ILDa and may combine with them or dangling bond to form silicon oxynitride.

By the doping of the impurities during the deposition of the first upper insulating layer ILDa, in a subsequent anisotropic etching process of the first mold structure ML1, it is possible to prevent/reduce a bowing phenomenon from being deepened in the first upper insulating layer IDLa which is the uppermost layer of the first mold structure ML1. For example, the bowing phenomenon may be a lateral recess formed in a layer, e.g., in the uppermost layer of the first mold structure ML1, e.g., by an over etch on a side wall (e.g., a lateral surface) of the layer in an etching process.

Figure 8:
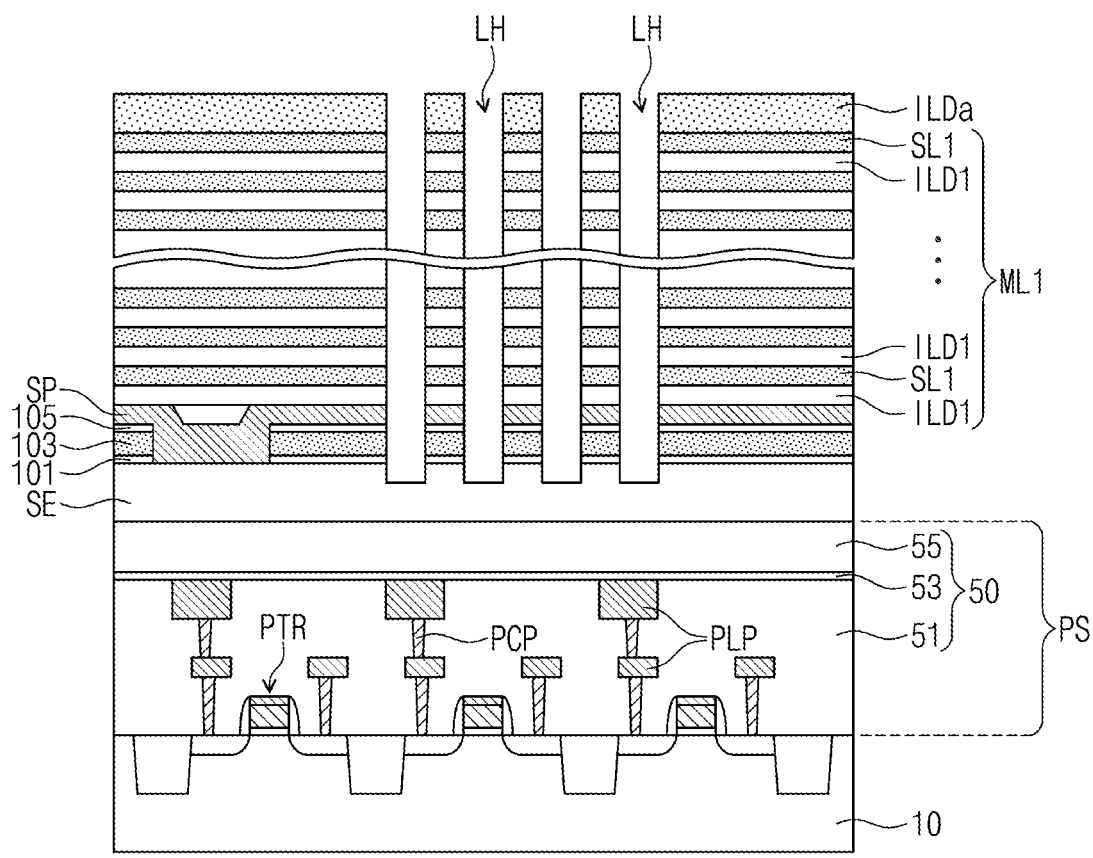

Referring to FIG. 8, lower channel holes LH passing through the first mold structure ML1 may be formed in the cell array region. The lower channel holes LH may pass through the support conductive layer SP and the first, second, and third insulating layers 101, 103, and 105 to expose the semiconductor layer SE. In a plan view, the lower channel holes LH may be arranged in one direction (e.g., in a line) or in a zigzag pattern. A detailed description of a planar arrangement of the lower channel holes LH may be the same as a planar arrangement of the vertical structures VS described above with reference to FIG. 5A.

The forming of the lower channel holes LH may include forming a mask pattern (not shown) having openings defining regions where the lower channel holes LH are to be formed on the first mold structure ML1 and anisotropically etching the first mold structure ML1, the support conductive layer SP, and the first, second, and third insulating layers 101, 103, and 105 using the mask pattern as an etch mask.

The anisotropic etching process may include a plasma etching, a reactive ion etching (RIE), an inductively coupled plasma reactive ion etching (ICP-RIE), or an ion beam etching (IBE) process.

The anisotropic etching process for the first mold structure ML1 may use an etching recipe capable of continuously anisotropically etching the first upper insulating layer ILDa, the first sacrificial layers SL1, and the first interlayer insulating layers ILD1. The anisotropic etching process for the first mold structure ML1 may include a plasma process in a cryogenic environment, for example, a cleaning process or an etching process (e.g., a plasma cleaning or a plasma etching). During the anisotropic etching process for the first mold structure ML1, the semiconductor substrate 10 may be maintained at a cryogenic temperature of about −30° C. to −130° C. The anisotropic etching process at the cryogenic temperature may reduce a loading effect when the lower channel holes LH having a high aspect ratio are formed. For example, a height of the lower channel holes LH may be 30 times or more, 40 times or more, or 50 times or more greater than a width of the lower channel holes LH.

The anisotropic etching process at the cryogenic temperature may minimize the bowing phenomenon in the first upper insulating layer ILDa positioned at the uppermost layer of the first mold structure ML1. Accordingly, performing the anisotropic etching process at the cryogenic temperature may be helpful to prevent a sidewall from having a negative slope at an upper region of the lower channel hole LH due to the bowing of the first upper insulating layer ILDa. For example, each of the lower channel holes LH may have a maximum width at a vertical level of a top surface of the first upper insulating layer ILDa, and sidewalls of the lower channel holes LH may have a constant positive slope. For example, each of the widths of the lower channel holes LH may increase in a direction approaching the top surface of the first upper insulating layer ILDa.

In the anisotropic etching process for forming the lower channel holes LH, the semiconductor layer SE may be over-etched to the top surface thereof, and thus the top surface of the semiconductor layer SE exposed to the lower channel holes LH may be recessed to a certain depth. For example, the bottom surfaces of the lower channel holes LH may be located at a level lower than the top surface of the semiconductor layer SE.

Figure 9:
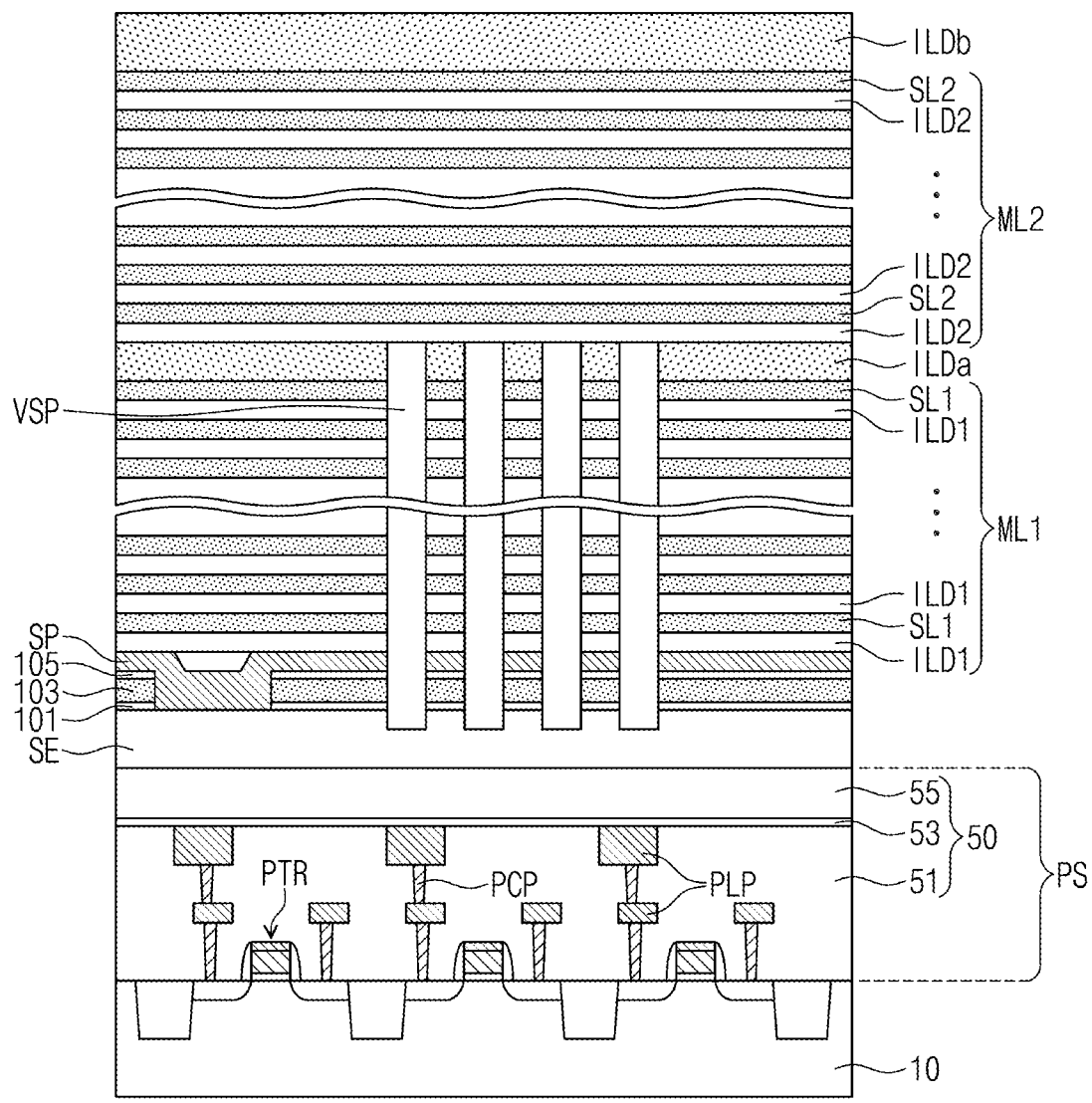

Referring to FIG. 9, vertical sacrificial patterns VSP may be formed in the lower channel holes LH.

The vertical sacrificial patterns VSP may be formed of a material having etch selectivity with respect to the first mold structure ML1. For example, the vertical sacrificial patterns VSP may be formed of a material capable of being etched having etch selectivity with respect to the first interlayer insulating layers ILD1 and the first upper insulating layer ILDa. For example, the vertical sacrificial patterns VSP may be formed of polysilicon or a material containing carbon (C).

A second mold structure ML2 may be formed on the first mold structure ML1.

In the second mold structure ML2, second interlayer insulating layers ILD2 and second sacrificial layers SL2 are alternately and repeatedly stacked on the first mold structure ML1, and a second upper insulating layer ILDb may be stacked and formed on the uppermost second sacrificial layer SL2. In some embodiments, the second sacrificial layers SL2 may be formed of the same material as a material of the first sacrificial layers SL1, and the second sacrificial layers SL2 may have substantially the same thickness as a thickness of the first sacrificial layers SL1. The second upper insulating layer ILDb may have a thickness greater than a thickness of each of the second interlayer insulating layers ILD2.

The forming of the second mold structure ML2 may be substantially the same as the forming of the first mold structure ML1 described above with reference to FIG. 7. For example, the second sacrificial layers SL2 may be formed of an insulating material different from an insulating material of the second interlayer insulating layers ILD2 and the second upper insulating layer ILDb. The second sacrificial layers SL2 may be formed of the same material as a material of the first sacrificial layers SL1. For example, each of the second sacrificial layers SL2 may be a silicon nitride layer, and each of the second interlayer insulating layers ILD2 may be an undoped silicon oxide layer. The second upper insulating layer ILDb may be a silicon oxide layer doped with impurities. The impurities in the second upper insulating layer ILDb may include nitrogen or phosphorus.

Figure 10:
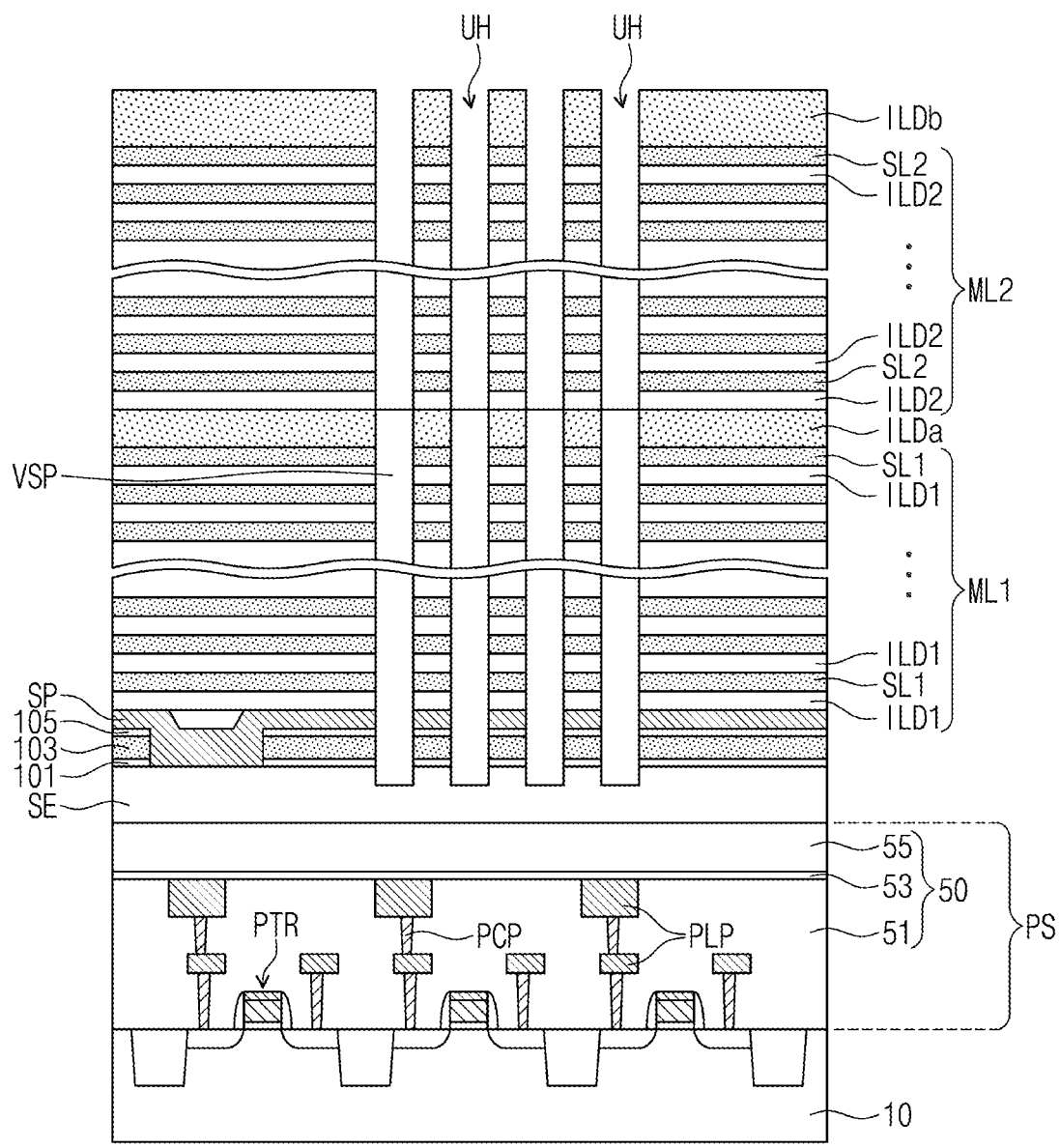

Referring to FIG. 10, upper channel holes UH passing through the second mold structure ML2 may be formed in the cell array region. The upper channel holes UH may expose the vertical sacrificial patterns VSP. For example, the upper channel holes UH may expose respective top surfaces of the vertical sacrificial patterns VSP.

The upper channel holes UH may be formed by performing an anisotropic etching process on the second mold structure ML2. As described above with reference to FIG. 8, the anisotropic etching process for the second mold structure ML2 may include a plasma process in a cryogenic environment, for example, a cryogenic cleaning process or a cryogenic etching process. The anisotropic etching process at a cryogenic temperature may minimize the bowing phenomenon in the second upper insulating layer ILDb positioned at the uppermost layer of the second mold structure ML2. Accordingly, each of the upper channel holes UH may have a maximum width at a vertical level of a top surface of the second upper insulating layer ILDb, and sidewalls of the upper channel holes UH may have a constant positive slope. For example, each of the widths of the upper channel holes UH may increase in a direction approaching the top surface of the second upper insulating layer ILDb. For example, a height of the upper channel holes UH may be 30 times or more, 40 times or more, or 50 times or more greater than a width of the upper channel holes UH.

After forming the upper channel holes UH, a process of removing the vertical sacrificial patterns VSP may be performed. Accordingly, vertical channel holes through which the upper channel holes UH and the lower channel holes LH are connected to expose the semiconductor layer SE may be formed. For example, each of the vertical channel holes may be a combination of an upper channel hole UH and a lower channel hole LH vertically overlapping each other. For example, the vertical channel holes may pass through the first and second mold structures ML1 and ML2.

Figure 11:
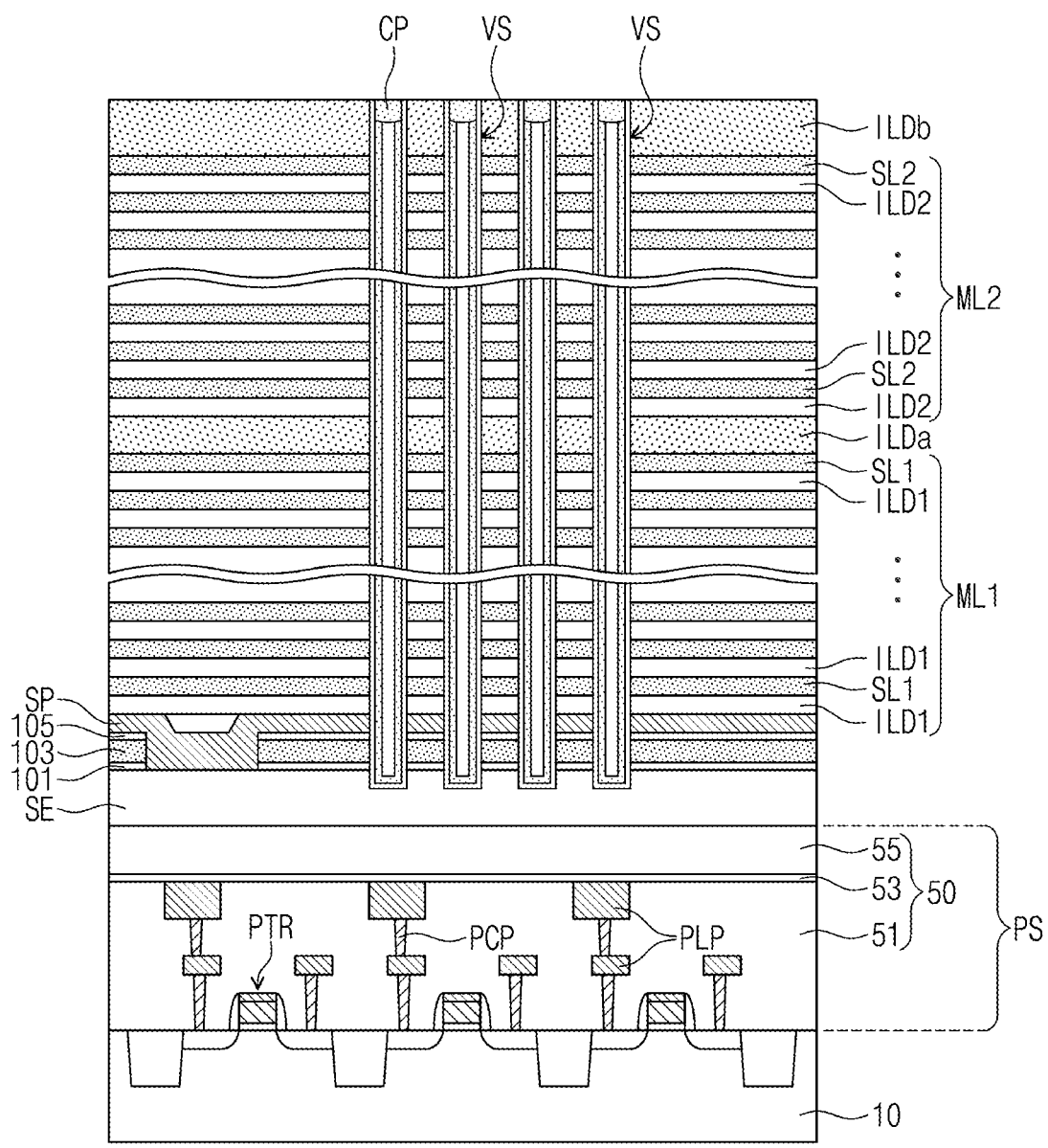

Subsequently, referring to FIG. 11, vertical structures VS may be formed in the vertical channel holes, respectively. Top surfaces of the vertical structures VS may be coplanar with the top surface of the second upper insulating layer ILDb.

The forming of the vertical structures VS may include sequentially depositing a data storage layer and a vertical semiconductor layer in the vertical channel holes, and etching and/or planarizing the data storage layer and the vertical semiconductor layer on the second upper insulating layer ILDb.

The data storage layer may be deposited to a uniform thickness on bottom surfaces and inner walls of the vertical channel holes using a chemical vapor deposition (CVD) or an atomic layer deposition (ALD) method. The data storage layer may include a tunneling insulating layer, a charge storage layer, and a blocking insulating layer that are sequentially stacked. The vertical semiconductor layer may be deposited to a uniform thickness on the data storage layer using a chemical vapor deposition (CVD) or an atomic layer deposition (ALD) method. After the data storage layer and the vertical semiconductor layer are formed, the vertical channel holes may be filled with gap-fill insulating layers, respectively. Accordingly, as described above with reference to FIGS. 6A and 6B, the data storage patterns DSP, the vertical semiconductor patterns VP, and the gap-fill insulating patterns VI may be formed.

Subsequently, bit line conductive pads CP may be formed on top of the vertical semiconductor patterns. The bit line conductive pads CP may be impurities regions doped with impurities or may be formed of a conductive material. Top surfaces of the bit line conductive pads CP may be coplanar with the top surface of the second upper insulating layer ILDb.

Figure 12:
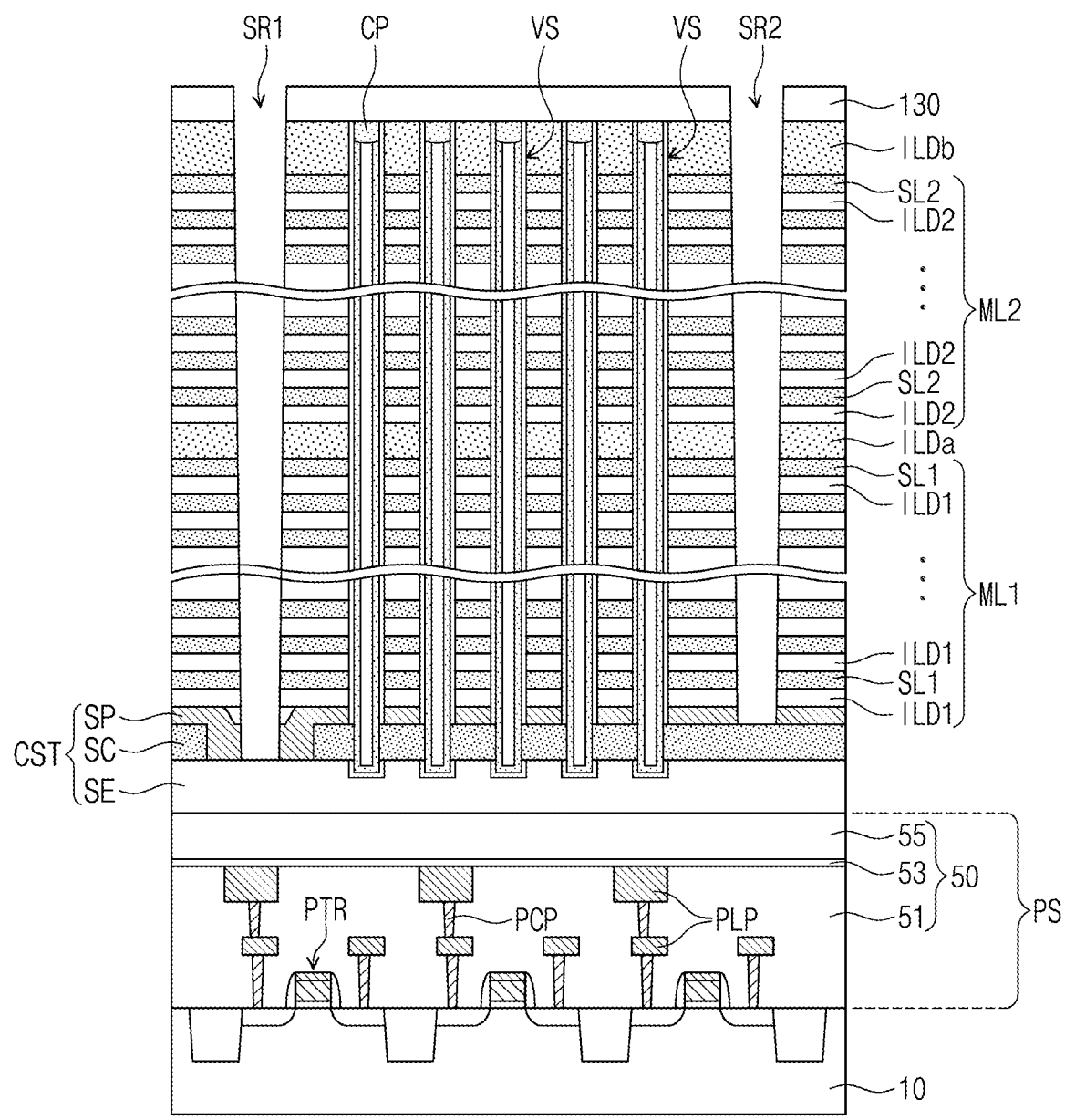

Referring to FIGS. 5A and 12, after forming the vertical structures VS, a first planar insulating layer 130 covering top surfaces of the vertical structures VS may be formed.

First and second isolation trenches SR1 and SR2 exposing the support conductive layer SP may be formed through the first and second mold structures ML1 and ML2.

The first and second isolation trenches SR1 and SR2 may be formed by anisotropically etching the first planar insulating layer 130 and the first and second mold structures ML1 and ML2. During the process, the support conductive layer SP may be used as an etch stop layer.

The first and second isolation trenches SR1 and SR2 may extend in the first direction D1. The first isolation trenches SR1 may extend from the cell array region CAR to the connection region CNR in the first direction D1. The second isolation trenches SR2 may extend from the cell array region CAR to the connection region CNR in the first direction D1 and may be shorter than the first isolation trenches SR1. A third isolation trenches may be disposed to be spaced apart from the second isolation trenches SR2 in the first direction D1 in the connection region CNR, and may extend in the first direction D1.

After forming the first and second isolation trenches SR1 and SR2, replacing the first insulating layer 101, the second insulating layer 103, and the third insulating layer 105 in the cell array region CAR with a source conductive pattern SC may be performed.

The forming of the source conductive pattern SC may include isotropically etching on the first, second, and third insulating layers 101, 103, and 105 exposed to the first and second isolation trenches SR1 and SR2. During the isotropic etching, some parts of the data storage pattern may also be isotropically etched to expose some parts of the vertical semiconductor patterns (refer to VP of FIG. 6A). After exposing some parts of the vertical semiconductor patterns (refer to VP of FIG. 6A), a polysilicon layer doped with impurities may be deposited to form a source conductive pattern SC. Accordingly, a source structure CST may be formed between the peripheral circuit structure PS and the mold structure ML1 and ML2.

Figure 13:
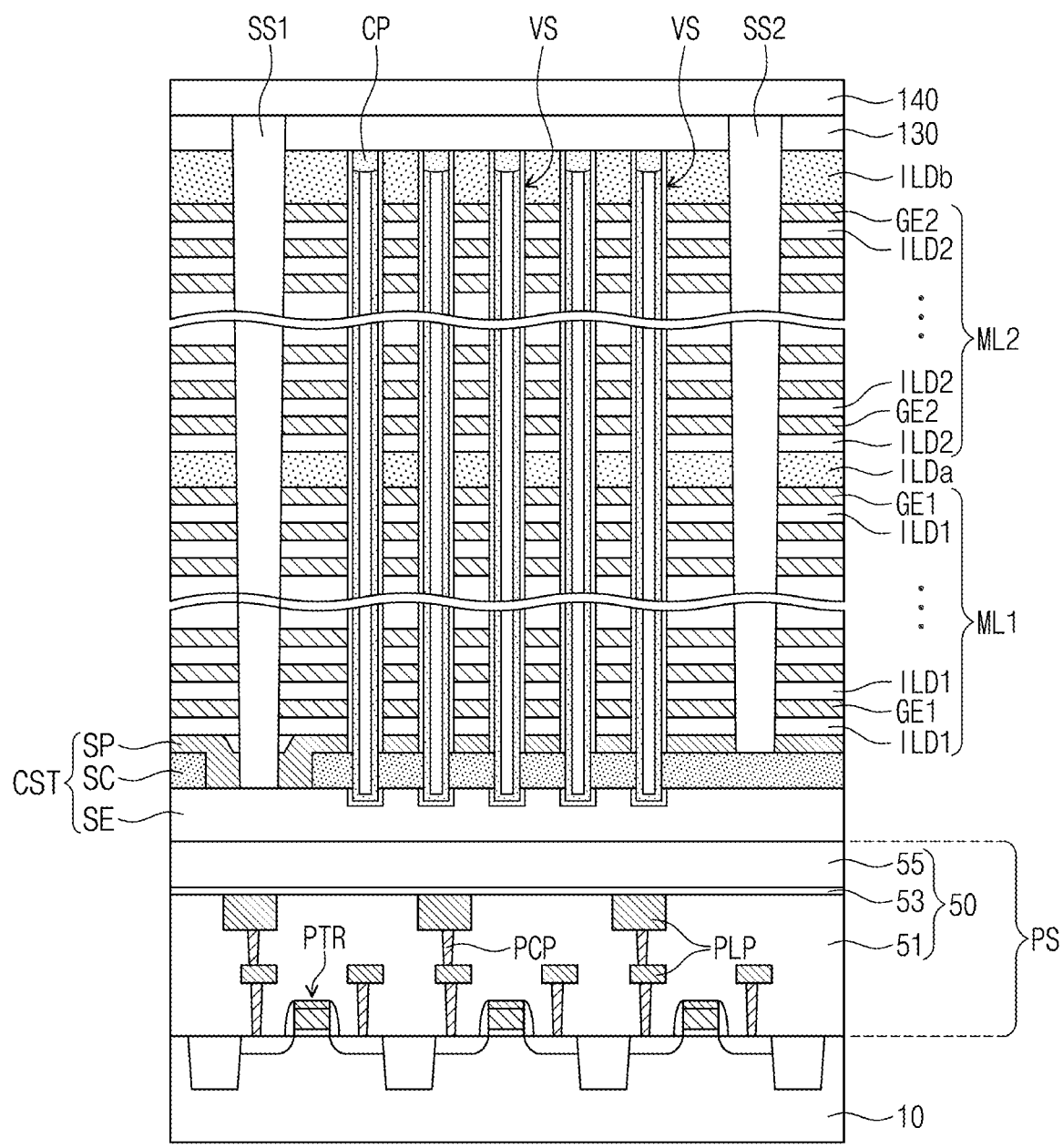

Referring to FIG. 13, after forming the source structure CST, replacing the first and second sacrificial layers SL1 and SL2 with first and second electrodes GE1 and GE2 may be performed, thereby forming the above-described stacked structure ST. The forming of the stacked structure ST may include isotropically etching the first and second sacrificial layers SL1 and SL2 using an etch recipe having etch selectivity with respect to the first and second interlayer insulating layers ILD1 and ILD2, the first and second upper insulating layers ILDa and ILDb, the vertical structures VS, and the source structure CST. During the isotropic etching process of the first and second sacrificial layers SL1 and SL2, some parts of the first and second sacrificial layers SL1 and SL2 may remain in the connection region CNR, and thus mold patterns (refer to MP of FIG. 14) may be formed.

After forming the first and second electrodes GE1 and GE2, an insulating material may be buried/filled in the first and second isolation trenches SR1 and SR2 to form first and second isolation structures SS1 and SS2.

Then, referring to FIGS. 5A and 5B, the bit line contact plugs BCTa and BCTb electrically connected to the vertical structures VS may be formed. The bit line contact plugs BCTa and BCTb may include or be formed of metal and/or metal nitride.

The bit lines BL may be formed on a fourth interlayer insulating layer 160, and may be electrically connected to the bit line contact plugs BCTa and BCTb, respectively.

Figure 14:
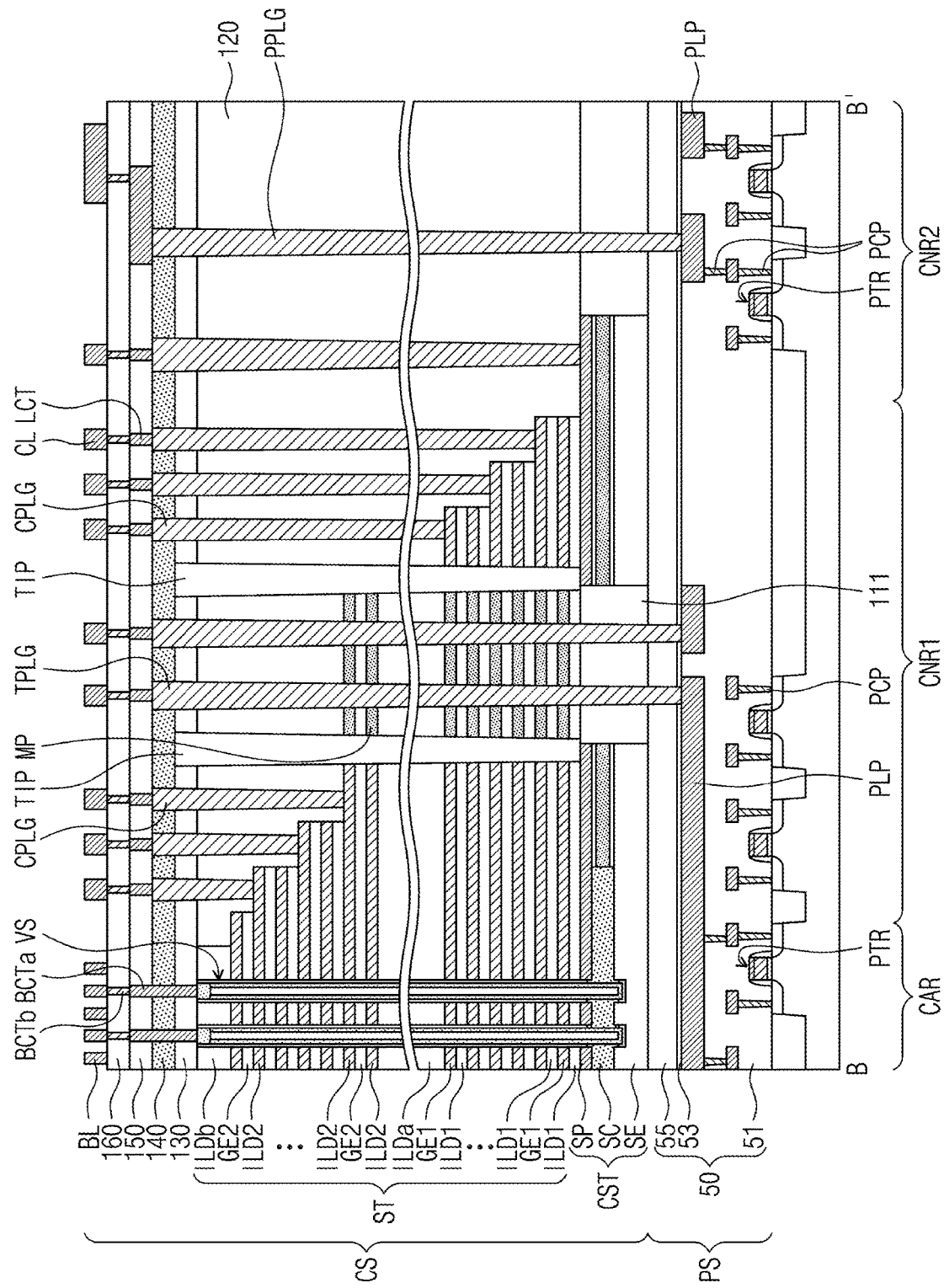
FIG. 14 is a cross-sectional view of a semiconductor device according to an embodiment of the inventive concept and is a cross-sectional view taken along line B-B' of FIG. 5A.

FIG. 14 is a cross-sectional view of a semiconductor device according to an embodiment of the inventive concept, and is a cross-sectional view taken along line B-B' of FIG. 5A. In the present embodiment, detailed descriptions of technical features overlapping with those previously described with reference to FIGS. 5A and 5B will be omitted, and differences will be described in detail.

Referring to FIGS. 5A and 14, a semiconductor device according to embodiments of the inventive concept may include a peripheral circuit structure PS on a semiconductor substrate 10 and a cell array structure CS on the peripheral circuit structure PS.

The semiconductor substrate 10 may include a cell array region CAR and first and second connection regions CNR1 and CNR2. The first connection region CNR1 may be disposed between the cell array region CAR and the second connection region CNR2 in a first direction D1.

In some embodiments, a lower through insulating pattern 111 passing through the source structure CST may be provided in the first connection region CNR1. The lower through insulating pattern 111 may be in contact with a peripheral circuit insulating layer 50.

A dummy insulating pattern may be disposed between the semiconductor layer SE and the stacked structure ST in the first connection region CNR1. The dummy insulating pattern may be some parts of the first, second, and third insulating layers (refer to 101, 103, and 105 of FIG. 7) described above with reference to FIG. 7. For example, portions of the first, second, and third insulating layers 101, 103, and 105 may remain in the first connection region CNR1.

The stacked structure ST may be disposed on the source structure CST. The stacked structure ST may extend from the cell array region CAR to the connection region CNR in the first direction D1, and may have a stepped structure in the connection region CNR. For example, the first and second electrodes GE1 and GE2, and the first and second insulating layers ILD1 and ILD2 may have different lengths in the connection region CNR to form a step structure.

Each of the first and second electrodes GE1 and GE2 may include pad parts in the first connection region CNR1, and cell contact plugs CPLG may be electrically connected to and/or may contact the pad parts of the first and second electrodes GE1 and GE2.

According to embodiments, the stacked structure ST may include mold patterns MP positioned at the same level as the first and second electrodes GE1 and GE2 in the first connection region CNR1 and disposed between the first and second insulating layers ILD1 and ILD2, respectively. The mold patterns MP may include an insulating material different from those of the first and second interlayer insulating layers ILD1 and ILD2. The mold patterns MP may include or be formed of, for example, at least one of a silicon nitride layer, a silicon oxynitride layer, and silicon germanium. The mold patterns MP may be closer to the cell array region CAR than the pad parts of the first and second electrodes GE1 and GE2. Also, the mold patterns MP may vertically overlap the lower through insulating pattern 111, e.g., in a plan/cross-sectional view.

A through insulating pattern TIP may pass through a part of the stacked structure ST in the first connection region CNR1. The through insulating pattern TIP may be provided between the first and second electrodes GE1 and GE2 and the mold patterns MP. The through insulating pattern TIP may surround the mold patterns MP, e.g., in a plan view. The through insulating pattern TIP may include or be formed of an insulating layer that covers the sidewalls of the stacked structure ST and the sidewalls of the mold patterns MP. The through insulating pattern TIP may be in contact with the top surface of the support conductive pattern SP and/or the top surface of the lower through insulating pattern 111.

A filling insulating layer 120 may cover the pad parts of the stacked structure ST having a stepped structure. The filling insulating layer 120 may have a substantially flat top surface. The top surface of the filling insulating layer 120 may be substantially coplanar with the top surface of the second upper insulating layer ILDb positioned at the uppermost stacked structure ST. The filling insulating layer 120 may include or be formed of one insulating layer or a plurality of stacked insulating layers.

First to fourth planar insulating layers 130, 140, 150, and 160 may be sequentially stacked on the filling insulating layer 120. At least one of the first to fourth planar insulating layers 130, 140, 150, and 160 may include or be formed of silicon oxide doped with impurities (e.g., nitrogen or phosphorus) like the first and second upper insulating layers ILDa and ILDb described above. For example, the second planar insulating layer 140 may include or be formed of undoped silicon oxide, and the first planar insulating layer 130 may include or be formed of silicon oxide doped with impurities. In the second planar insulating layer 140, the impurities may include nitrogen or phosphorous. As another example, both the first and second planar insulating layers may be formed of silicon oxide doped with impurities.

The cell contact plugs CPLG may pass through the first and second planar insulating layers 130 and 140 and the filling insulating layer 120 to be respectively connected to the pad parts of the first and second electrodes GE1 and GE2. As the cell contact plugs CPLG are adjacent to the cell array region CAR, vertical lengths of the cell contact plugs CPLG may become shorter. For example, the cell contact plugs CPLG may have different lengths in a vertical direction, and the cell contact plug CPLG closer to the cell array region CAR may have the shorter vertical length. Top surfaces of the cell contact plugs CPLG may be substantially coplanar with one another. The top surfaces of the cell contact plugs CPLG may be substantially coplanar with the top surface of the second planar insulating layer 140. For example, the bottom surfaces of the cell contact plugs CPLG may be placed at different vertical levels, and the bottom surface of the cell contact plug CPLG further from the cell array region CAR may be at the lower vertical level.

Through contact plugs TPLG may vertically pass through the mold patterns MP and the lower through insulating pattern 111 of the stacked structure ST in the first connection region CNR1 to be electrically connected to and/or contact a peripheral circuit wiring PLP. The through contact plugs TPLG may be electrically connected to the cell contact plugs CPLG through conductive lines CL. Top surfaces of the through contact plugs TPLG may be substantially coplanar with the top surface of the second planar insulating layer 140.

Peripheral contact plugs PPLG may pass through the filling insulating layer 120 in the second connection region CNR2 to be electrically connected to and/or contact the peripheral circuit wiring PLP. The peripheral contact plugs PPLG may be horizontally spaced apart from the stacked structure ST. Top surfaces of the peripheral contact plugs PPLG may be positioned at substantially the same level as top surfaces of the through contact plugs TPLG. For example, top surfaces of the peripheral contact plugs PPLG may be coplanar with the top surfaces of the through contact plugs TPLG. The top surfaces of the peripheral contact plugs PPLG may be substantially coplanar with the top surface of the second planar insulating layer 140.

In embodiments, the cell contact plugs CPLG, the through contact plugs TPLG, and the peripheral contact plugs PPLG may be simultaneously formed. For example, cell contact holes, through contact holes, and peripheral contact holes in which the cell contact plugs CPLG, the through contact plugs TPLG, and the peripheral contact plugs PPLG are respectively formed may be simultaneously formed, e.g., with the same steps of process. The cell contact holes, the through contact holes, and the peripheral contact holes may be formed by anisotropically etching the cell array structure CS and the first and second planar insulating layers 130 and 140. Here, the second planar insulating layer 140 may be formed of an oxide doped with impurities, and thus the bowing phenomenon in the cell contact holes, the through contact holes, and the peripheral contact holes may be prevented.

The conductive lines CL may be disposed on the fourth planar insulating layer 160 of the connection region CNR, and may be electrically connected to the cell contact plugs CPLG through contact plugs LCT.

Figure 15:
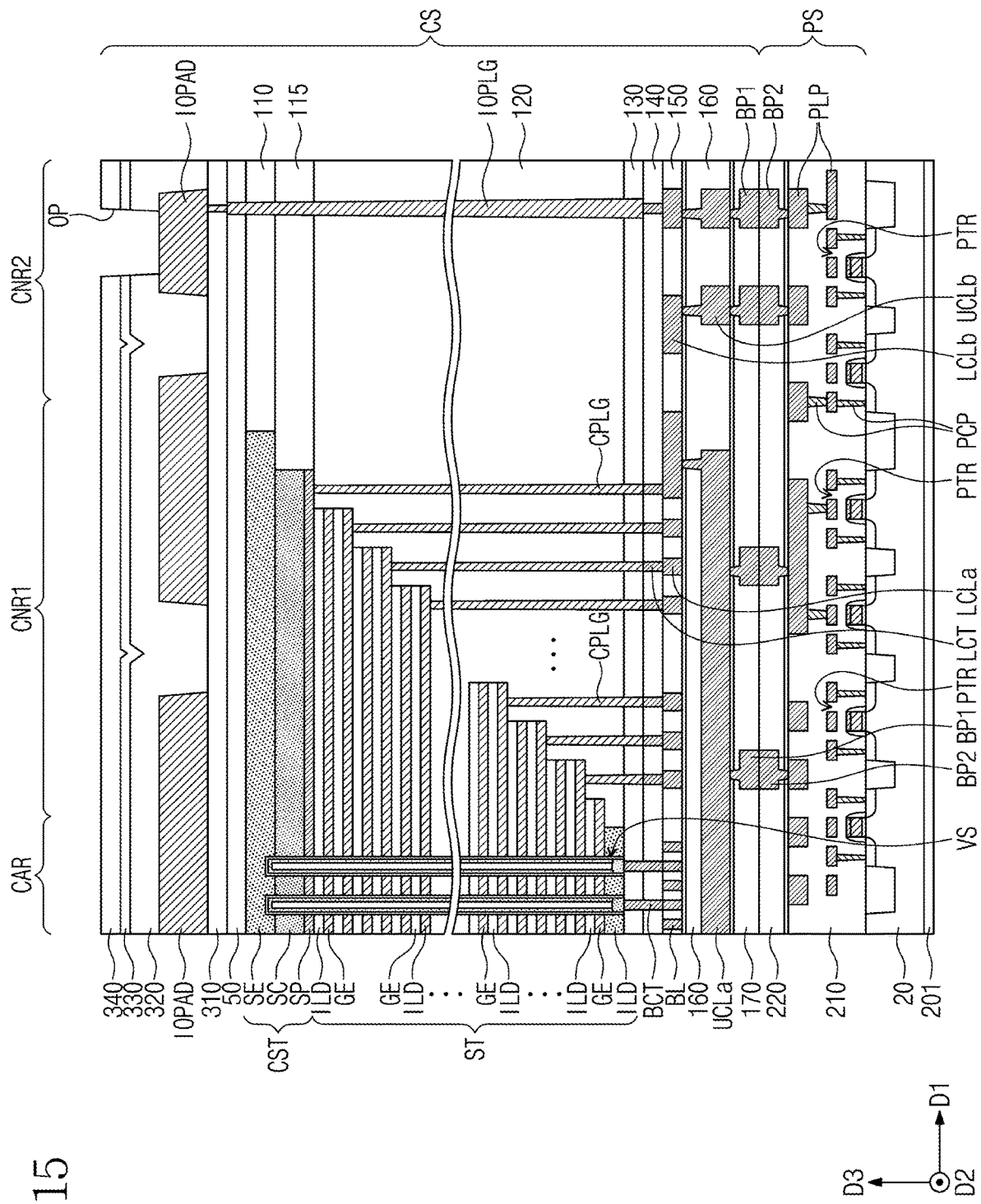
FIG. 15 is a cross-sectional view of a semiconductor device according to an embodiment of the inventive concept.

FIG. 15 is a cross-sectional view of a semiconductor device according to an embodiment of the inventive concept.

Referring to FIG. 15, a semiconductor device according to embodiments of the inventive concept may have a chip to chip (C2C) structure. The C2C structure may be manufactured by forming an upper chip including a cell array structure CS on a first wafer, forming a lower chip including a peripheral circuit structure PS on a second wafer different from the first wafer, and connecting/attaching the upper chip and the lower chip to each other by a bonding method. For example, the bonding method may be a method of electrically connecting bonding metal formed on the uppermost metal layer of the upper chip and bonding metal formed on the uppermost metal layer of the lower chip to each other. For example, the upper chip may be flipped in the bonding process so that the uppermost metal layer of the upper chip contacts the uppermost metal layer of the lower chip. For example, when the bonding metal is formed of copper (Cu), the bonding method may be a Cu-to-Cu bonding method. Alternatively, the bonding metal may also be formed of aluminum (Al) or tungsten (W).

The cell array structure CS may include a memory cell array including memory cells that are three-dimensionally arranged on a semiconductor layer SE. The memory cell array may be electrically connected to a first bonding pads BP1.

As described with reference to FIGS. 5A and 5B, the cell array structure CS may include a source structure CST, a stacked structure ST, vertical structures VS, bit lines BL, a cell contact plugs CPLG, and an input/output contact plug IOPLG.

The cell array structure CS may include a cell array region CAR and first and second connection regions CNR1 and CNR2, and the first connection region CNR1 may be disposed between the cell array region CAR and the second connection region CNR2 in a first direction D1.

The source structure CST may be disposed on a top surface of a peripheral circuit insulating layer 50 in the cell array region CAR and the first connection region CNR1. The source structure CST may extend in the first direction D1 in parallel with the stacked structure ST in the cell array region CAR and the first connection region CNR1. Insulation layers 110 and 115 covering sidewalls of the source structure CST may be disposed in the second connection region CNR2.

The stacked structure ST may be disposed on the source structure CST. In the stacked structure ST, electrodes GE and interlayer insulating layers ILD may be alternately stacked in a third direction D3 (i.e., a vertical direction) perpendicular to first and second directions D1 and D2 crossing each other. As described above with reference to FIGS. 5A and 5B, the stacked structure ST may include the first stacked structure ST1 and the second stacked structure ST2.

As described above with reference to FIGS. 5A and 5B, the interlayer insulating layers ILD may be formed of undoped silicon oxide. The uppermost one among the interlayer insulating layers ILD may cover the uppermost layer electrode GE and may be thicker than each interlayer insulating layer ILD. The uppermost interlayer insulating layer ILD may be formed of silicon oxide doped with impurities.

Each of the electrodes GE may include a pad part in the first connection region CNR1. The electrodes GE may be stacked on the source structure CST to have a stepped structure in the first connection region CNR1. The pad parts of the electrodes GE may be respectively placed in positions horizontally and vertically different from one another. The cell contact plugs CPLG may be respectively electrically connected to and/or may respectively contact the pad parts of the electrodes GE.

The plurality of vertical structures VS may pass through the stacked structure ST in the cell array region CAR. As described above, each of the vertical structures VS may include a vertical semiconductor pattern VP and a data storage pattern DSP surrounding a sidewall of the vertical semiconductor pattern VP.

Furthermore, as described above, dummy vertical structures DVS (shown in FIG. 5A) may pass through the pad parts of the electrodes GE in the first connection region CNR1. A filling insulating layer 120 may cover the step structure of the stacked structure ST. The filling insulating layer 120 may have a substantially flat top surface.

The cell contact plugs CPLG may pass through a first planar insulating layers 130 and the filling insulating layer 120 to be respectively electrically connected to and/or contact the pad parts of the electrodes GE. As the cell contact plugs CPLG are adjacent to the cell array region CAR, vertical lengths of the cell contact plugs CPLG may be shorter. For example, the cell contact plugs CPLG may have different lengths in a vertical direction, and the cell contact plug CPLG closer to the cell array region CAR may have the shorter vertical length. The top surfaces of the cell contact plugs CPLG may be substantially coplanar with one another.

The input/output contact plugs IOPLG may pass through the first planar insulating layer 130 and the filling insulating layer 120 to be electrically connected to input/output pads IOPAD, respectively.

The bit lines BL may be disposed on a fourth planar insulating layer 160 in the cell array region CAR, and may extend across the stacked structure ST in the second direction D2. The bit lines BL may be electrically connected to the vertical structures VS through bit line contact plugs BCT.

First lower conductive lines LCLa may be disposed on the fourth planar insulating layer 160 of the first connection region CNR1, and may be electrically connected to the cell contact plugs CPLG through contact plugs LCT.

Second lower conductive lines LCLb may be disposed on the fourth planar insulating layer 160 of the second connection region CNR2, and may be electrically connected to input/output contact plugs IOPLG through the contact plugs LCT.

First and second upper conductive lines UCLa and UCLb may be disposed in the fourth planar insulating layer 160. The first upper conductive lines UCLa may be electrically connected to first lower conductive lines LCLa in the cell array region CAR and/or the first connection region CNR1. The second upper conductive lines UCLb may be electrically connected to second lower conductive lines LCLb in the second connection region CNR2.

The first and second lower conductive lines LCLa and LCLb and the first and second upper conductive lines UCLa and UCLb may include or be formed of at least one selected from a metal (e.g., tungsten, copper, aluminum, etc.), a conductive metal nitride (e.g., titanium nitride, tantalum nitride, etc.) or a transition metal (e.g., titanium, tantalum, etc.). For example, the first and second lower conductive lines LCLa and LCLb may be formed of tungsten having a relatively high electrical resistivity, and the first and second upper conductive lines UCLa and UCLb may be formed of copper having a relatively low electrical resistivity.

First bonding pads BP1 may be provided in the uppermost planar insulating layer 170. The first bonding pads BP1 may be electrically connected to the first and second upper conductive lines UCLa and UCLb. The first bonding pads BP1 may be formed of aluminum, copper, tungsten, or the like.

The peripheral circuit structure PS may include peripheral circuits PTR formed on a semiconductor substrate 20 and controlling the memory cell array, and peripheral interlayer insulating layers 210 and 220 covering the peripheral circuits PTR. The peripheral circuits PTR may be integrated on a top surface of the semiconductor substrate 20. A surface insulating layer 201 may be provided on a bottom surface of the semiconductor substrate 20.

The peripheral circuits PTR may be or may include row and column decoders, a page buffer, a control circuit, and the like. For example, the peripheral circuits PTR may include NMOS and PMOS transistors. Peripheral circuit wirings PLP may be electrically connected to the peripheral circuits PTR through peripheral contact plugs PCP.

The peripheral interlayer insulating layers 210 and 220 may be provided on the top surface of the semiconductor substrate 20. The peripheral interlayer insulating layers 210 and 220 may cover the peripheral circuits PTR, the peripheral contact plugs PCP, and the peripheral circuit wirings PLP on the semiconductor substrate 20. The peripheral contact plugs PCP and the peripheral circuit wirings PLP may be electrically connected to the peripheral circuits PTR. The peripheral interlayer insulating layers 210 and 220 may include or be formed of a silicon oxide layer, a silicon nitride layer, a silicon oxynitride layer, and/or a low dielectric layer.

Second bonding pads BP2 may be provided in the uppermost peripheral interlayer insulating layer 220 to correspond to the first bonding pads BP1. The second bonding pads BP2 may be electrically connected to the peripheral circuits PTR through the peripheral circuit wirings PLP and the peripheral contact plugs PCP.

The second bonding pads BP2 may be electrically and physically connected to the first bonding pads BP1 by a bonding method, respectively. For example, the second bonding pads BP2 may be in contact with the first bonding pads BP1.

The second bonding pads BP2 may include or be formed of the same metal material as the first bonding pads BP1. The second bonding pads BP2 may have substantially the same shape, the same width, and/or the same area as the first bonding pads BP1.

The input/output pads IOPAD may be disposed on a surface insulating layer 310 of the cell array structure CS. A capping insulating layer 320 may be disposed on the surface insulating layer 310, and the capping insulating layer 320 may cover the input/output pads IOPAD.

A protective layer 330 and a passivation layer 340 may be sequentially formed on the entire surface of the capping insulating layer 320. The protective layer 330 may be, for example, a silicon nitride layer or a silicon oxynitride layer. The passivation layer 340 may be, for example, a polyimide-based material such as photo sensitive polyimide (PSPI).

The protective layer 330 and the passivation layer 340 may have a pad opening OP exposing a part of the input/output pads IOPAD.

Though different figures show variations of exemplary embodiments, these figures are not necessarily intended to be mutually exclusive from each other. Rather, as recognized from the context of the detailed description above, certain features depicted in different figures and/or described above can be combined with other features from other figures/embodiments to result in additional various embodiments, when taking the figures and related descriptions as a whole into consideration.

According to embodiments of the inventive concept, the bowing may be reduced in the upper insulating layer disposed at the top of the mold structure. Accordingly, the electrical short between the lower vertical structures due to the bowing may be prevented. In addition, the sacrificial material may be prevented from remaining in the vertical channel holes in the process of the forming of the vertical structures because the vertical channel holes have the sidewalls having the substantially uniform slope.

While example embodiments of the inventive concepts have been particularly shown and described, it will be understood by one of ordinary skill in the art that variations in form and detail may be made therein without departing from the spirit and scope of the attached claims.

What is claimed is:
1. A semiconductor device comprising:
 a stacked structure including electrodes stacked on a substrate, interlayer insulating layers interposed between the electrodes, and an upper insulating layer covering the uppermost electrode among the electrodes; and a vertical structure passing through the stacked structure in a vertical direction, wherein each of the interlayer insulating layers has a first thickness, and the upper insulating layer has a second thickness greater than the first thickness, and wherein the upper insulating layer includes an insulating material different from an insulating material of each of the interlayer insulating layers.

2. The semiconductor device of claim 1, wherein the upper insulating layer includes silicon oxide doped with impurities, and wherein each of the interlayer insulating layers includes undoped silicon oxide.

3. The semiconductor device of claim 1, wherein the upper insulating layer includes nitrogen or phosphorous.

4. The semiconductor device of claim 1, wherein a top surface of the vertical structure is coplanar with a top surface of the upper insulating layer.

5. The semiconductor device of claim 1, wherein the vertical structure has a maximum width at a top surface of the upper insulating layer.

6. The semiconductor device of claim 1, wherein a sidewall of the vertical structure has a uniform slope from bottom to top.

7. The semiconductor device of claim 1, wherein a distance between the vertical structure and an adjacent vertical structure is shorter than a maximum width of each of the vertical structures.

8. The semiconductor device of claim 1, further comprising a source structure disposed between the substrate and the stacked structure, and electrically connected to the vertical structure, wherein the source structure includes a source semiconductor pattern on the substrate and a support conductive pattern between the stacked structure and the source semiconductor pattern.

9. The semiconductor device of claim 8, wherein the vertical structure includes a vertical channel pattern in which a part of a sidewall thereof is in contact with the source semiconductor pattern and a data storage pattern surrounding the sidewall of the vertical channel pattern on the source semiconductor pattern.

10. The semiconductor device of claim 1, wherein the substrate includes a cell array region and a connection region, wherein the stacked structure has a step structure in the connection region, wherein the semiconductor device further includes:

a planar insulating layer disposed on the stacked structure in the cell array region and the connection region; and cell contact plugs in contact with respective end portions of the electrodes through the planar insulating layer in the connection region, wherein the interlayer insulating layers include an undoped oxide, and wherein the planar insulating layer includes an oxide doped with impurities.

11. The semiconductor device of claim 10, wherein top surfaces of the cell contact plugs are coplanar with a top surface of the planar insulating layer.

12. A semiconductor device comprising:

a peripheral circuit structure including peripheral circuits integrated on a semiconductor substrate;

a first stacked structure including first electrodes and first interlayer insulating layers alternately stacked on the peripheral circuit structure, and a first upper insulating layer covering the uppermost first electrode among the first electrodes;

a second stacked structure including second electrodes and second interlayer insulating layers alternately stacked on the first stacked structure, and a second upper insulating layer covering the uppermost second electrode among the second electrodes; and a vertical structure passing through the first and second stacked structures, wherein the first and second upper insulating layers include an insulating material different from an insulating material of the first and second interlayer insulating layers.

13. The semiconductor device of claim 12, wherein each of the first and second interlayer insulating layers has a first thickness, and wherein the first upper insulating layer has a second thickness greater than the first thickness.

14. The semiconductor device of claim 13, wherein the second upper insulating layer has a third thickness greater than the first thickness.

15. The semiconductor device of claim 12, wherein the first upper insulating layer is disposed between the uppermost first electrode and the lowest second interlayer insulating layer.

16. The semiconductor device of claim 12, wherein the first and second upper insulating layers include silicon oxide doped with impurities, wherein each of the first and second interlayer insulating layers includes undoped silicon oxide.

17. The semiconductor device of claim 16 wherein the impurities include nitrogen or phosphorous in the first and second upper insulating layers.

18. The semiconductor device of claim 12, wherein the vertical structure includes:

a first vertical extension passing through the first stacked structure; and a second vertical extension passing through the second stacked structure, wherein a lower width of the second vertical extension is shorter than an upper width of the first vertical extension.

19. An electronic system comprising:

a semiconductor device which includes a stacked structure including electrodes stacked on a substrate, interlayer insulating layers interposed between the electrodes, and an upper insulating layer covering the uppermost electrode among the electrodes, a vertical structure passing through the stacked structure, and an input/output pad electrically connected to peripheral circuits; and a controller electrically connected to the semiconductor device through the input/output pad and configured to control the semiconductor device, wherein each of the interlayer insulating layers has a first thickness, and the upper insulating layer has a second thickness greater than the first thickness, and wherein the upper insulating layer includes an insulating material different from an insulating material of each of the interlayer insulating layers.

20. The electronic system of claim 19, wherein the upper insulating layer includes silicon oxide doped with impurities, and wherein each of the interlayer insulating layers includes undoped silicon oxide.

* * * * *